(12) United States Patent  
Kweon et al.

(10) Patent No.: US 12,513,973 B2
(45) Date of Patent: Dec. 30, 2025

(54) WAFER STRUCTURE AND SEMICONDUCTOR DEVICE

(71) Applicant: Samsung Electronics Co., Ltd., Suwon-si (KR)

(72) Inventors: Junyun Kweon, Cheonan-si (KR); Yeongbeom Ko, Cheonan-si (KR); Wooju Kim, Anyang-si (KR); Heejae Nam, Anyang-si (KR); Jungseok Ryu, Anyang-si (KR); Junho Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 530 days.

(21) Appl. No.: 17/896,578

(22) Filed: Aug. 26, 2022

(65) Prior Publication Data

US 2023/0260845 A1    Aug. 17, 2023

(30) Foreign Application Priority Data

Feb. 16, 2022    (KR) .................. 10-2022-0020412

(51) Int. Cl.
| | |
|---|---|
| *H10D 84/03* | (2025.01) |
| *H01L 21/78* | (2006.01) |

(Continued)

(52) U.S. Cl.
CPC .......... *H10D 84/038* (2025.01); *H01L 21/78* (2013.01); *H01L 23/562* (2013.01); *H01L 24/03* (2013.01);

(Continued)

(58) Field of Classification Search
CPC ............. H10D 84/038; H10D 84/0135; H10D 84/0149; H01L 21/78; H01L 23/562; H01L 24/03; H01L 24/05; H01L 24/16; H01L 24/48; H01L 25/18; H01L 2224/03; H01L 2224/04042; H01L 2224/16145; H01L 2224/32145; H01L 2224/73265; H01L 2225/0651; H01L 2225/06562;

(Continued)

(56) References Cited

U.S. PATENT DOCUMENTS

| | | |
|---|---|---|
| 7,498,660 B2 | 3/2009 | Kumagai |
| 9,165,938 B1 | 10/2015 | Kim et al. |
| 9,564,079 B2 | 2/2017 | Namkung |
| 10,002,808 B2 | 6/2018 | Abe et al. |
| 10,381,373 B2 * | 8/2019 | Okizumi ............... H10B 43/10 |

(Continued)

*Primary Examiner* — Michelle Mandala
(74) *Attorney, Agent, or Firm* — HARNESS, DICKEY & PIERCE, P.L.C.

(57) ABSTRACT

Disclosed are wafer structures and semiconductor devices. A semiconductor device may include a substrate and a cell array structure on the substrate. The substrate may include a device region and a dummy region surrounding the device region in a plan view. The cell array structure may include a plurality of first dielectric layers, a plurality of gate structures, a vertical channel structure, and a dummy pattern. The vertical channel structure may be on the device region and may penetrate the plurality of gate structures and the plurality of first dielectric layers. The cell array structure includes an outer sidewall above an edge of the substrate and a recessed portion on the outer sidewall of the cell array structure. The dummy pattern may cover a sidewall of the recessed portion and a bottom surface of the recessed portion. The dummy pattern and vertical channel structure may include a same material.

10 Claims, 29 Drawing Sheets

(51) Int. Cl.
    *H01L 23/00*      (2006.01)
    *H01L 25/18*      (2023.01)
    *H10B 43/27*      (2023.01)
    *H10B 43/50*      (2023.01)
    *H10D 84/01*      (2025.01)
    *H10B 43/10*      (2023.01)
    *H10B 43/40*      (2023.01)

(52) U.S. Cl.
    CPC .............. *H01L 24/05* (2013.01); *H01L 24/16* (2013.01); *H01L 24/48* (2013.01); *H01L 25/18* (2013.01); *H10B 43/27* (2023.02); *H10B 43/50* (2023.02); *H10D 84/0135* (2025.01); *H10D 84/0149* (2025.01); *H01L 2224/03* (2013.01); *H01L 2224/04042* (2013.01); *H01L 2224/16145* (2013.01); *H01L 2224/32145* (2013.01); *H01L 2224/73265* (2013.01); *H01L 2225/0651* (2013.01); *H01L 2225/06562* (2013.01); *H10B 43/10* (2023.02); *H10B 43/40* (2023.02)

(58) Field of Classification Search
    CPC ........ H10B 43/27; H10B 43/50; H10B 43/10; H10B 43/40
    See application file for complete search history.

(56) References Cited

U.S. PATENT DOCUMENTS

| | | | |
|---|---|---|---|
| 10,396,088 B2* | 8/2019 | Lee | H10B 43/35 |
| 10,748,634 B2* | 8/2020 | Kim | G11C 19/28 |
| 10,763,222 B2 | 9/2020 | Jeong et al. | |
| 11,322,515 B2* | 5/2022 | Song | H10B 43/10 |
| 11,404,435 B2* | 8/2022 | Choi | H10B 43/10 |
| 2019/0312143 A1* | 10/2019 | Lin | H10D 84/017 |
| 2020/0185408 A1* | 6/2020 | Song | H10B 43/27 |
| 2021/0050264 A1 | 2/2021 | Won et al. | |
| 2021/0057544 A1* | 2/2021 | Lin | H10D 84/85 |
| 2021/0167076 A1 | 6/2021 | Xu et al. | |
| 2021/0313240 A1* | 10/2021 | Tanamachi | H01L 23/53295 |
| 2021/0313246 A1* | 10/2021 | Matsumura | H10B 43/40 |
| 2021/0313281 A1* | 10/2021 | Kaminaga | H10B 43/10 |
| 2022/0344368 A1* | 10/2022 | Kang | H10B 43/27 |

\* cited by examiner

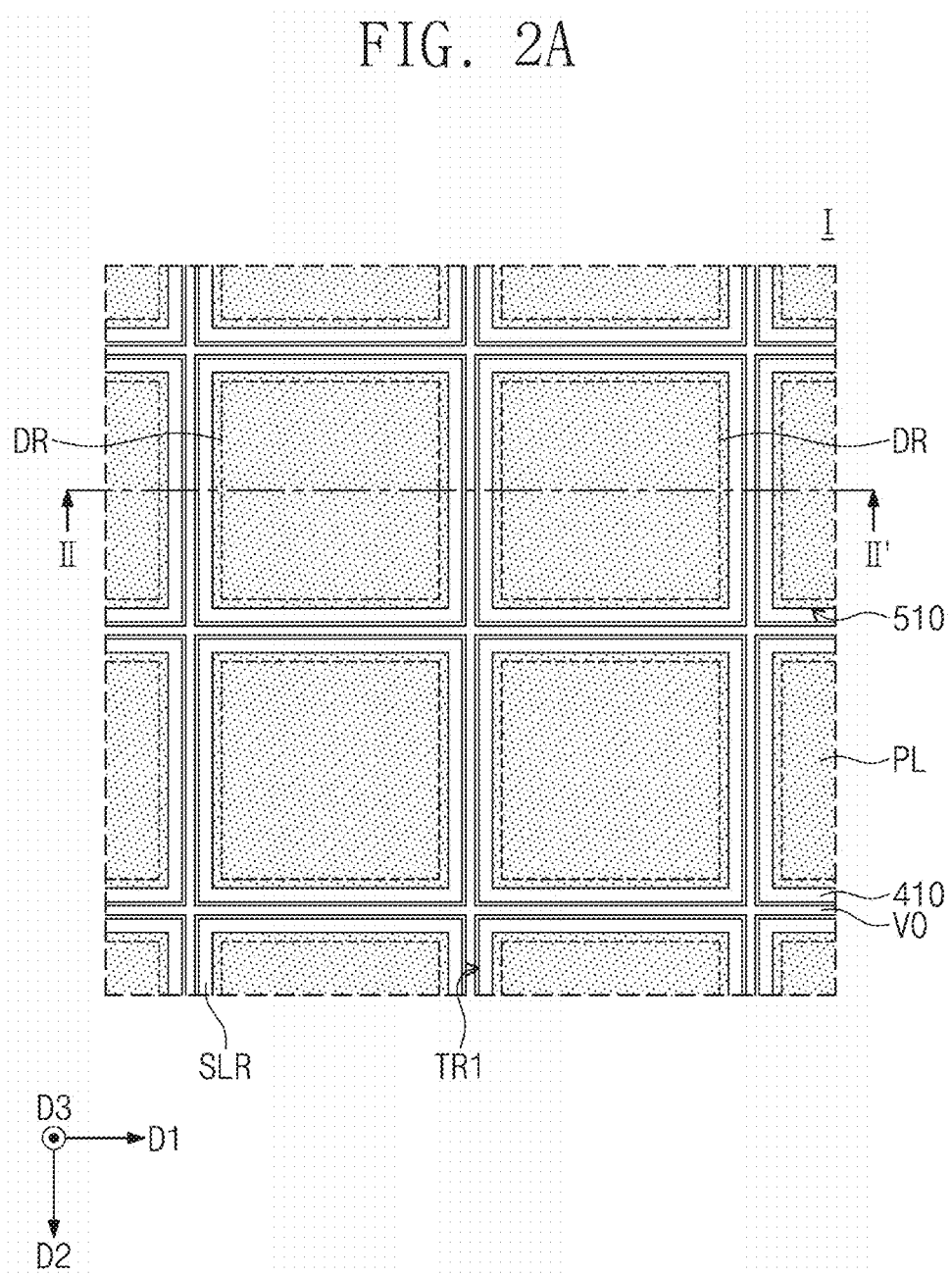

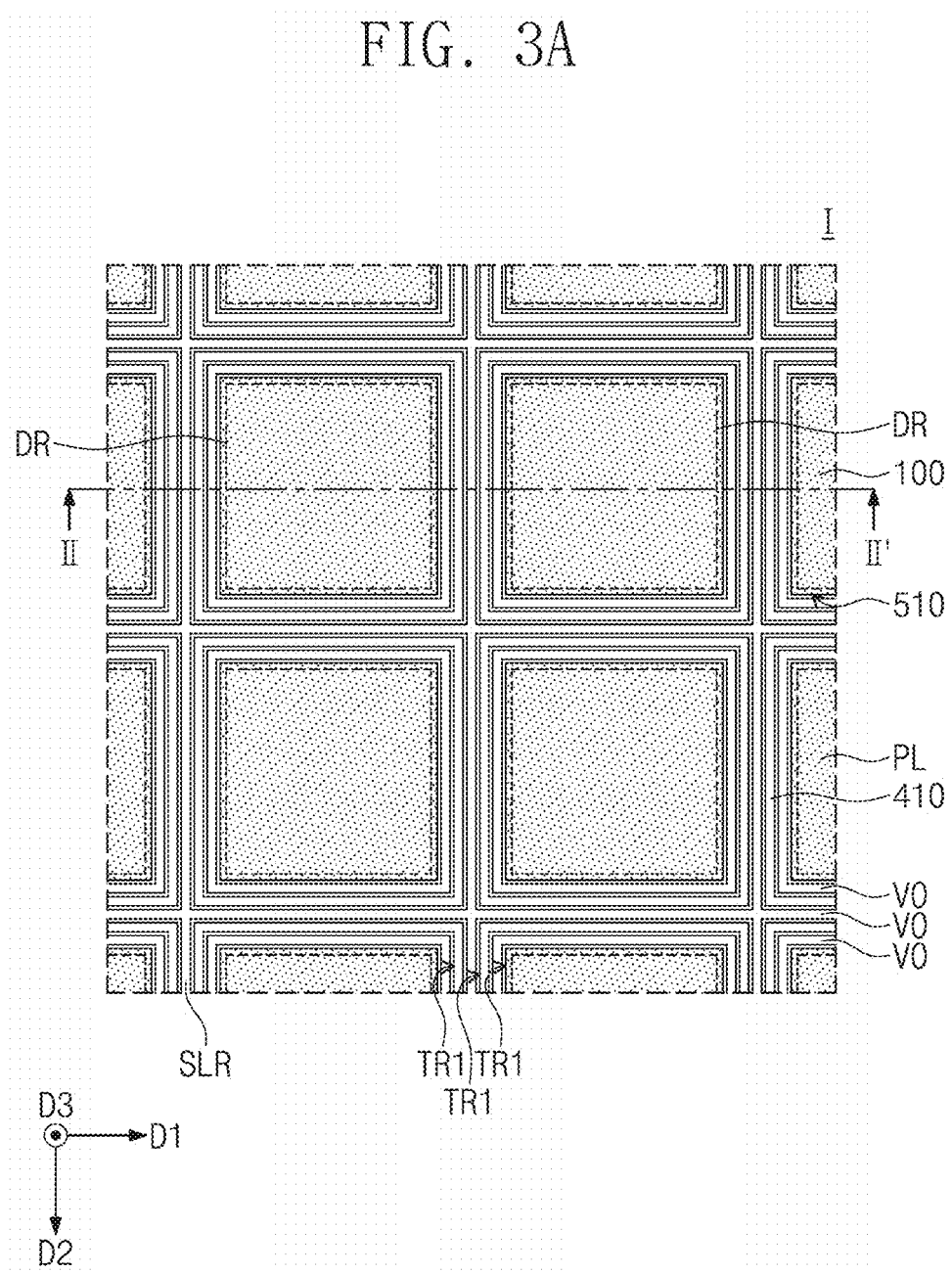

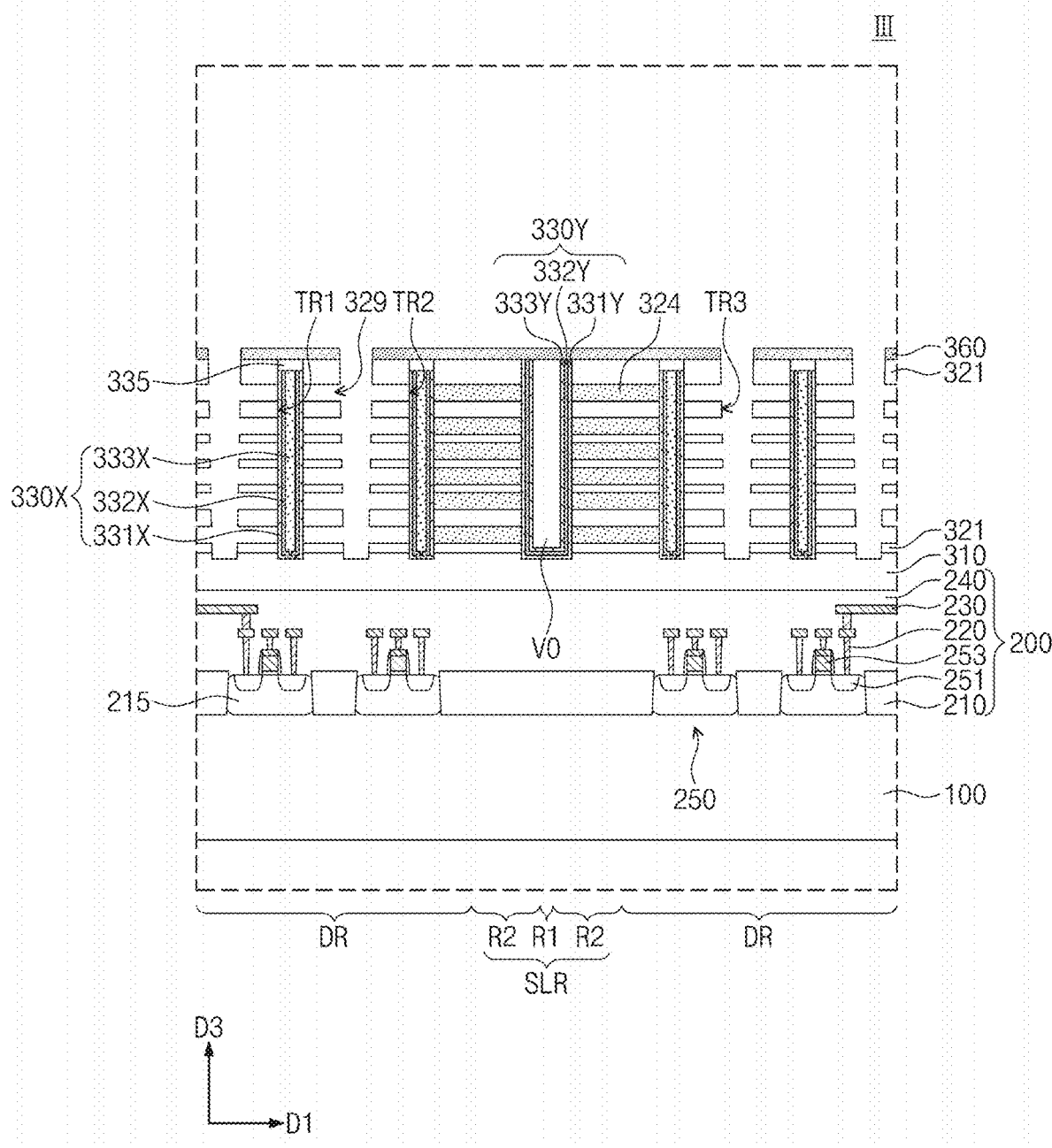

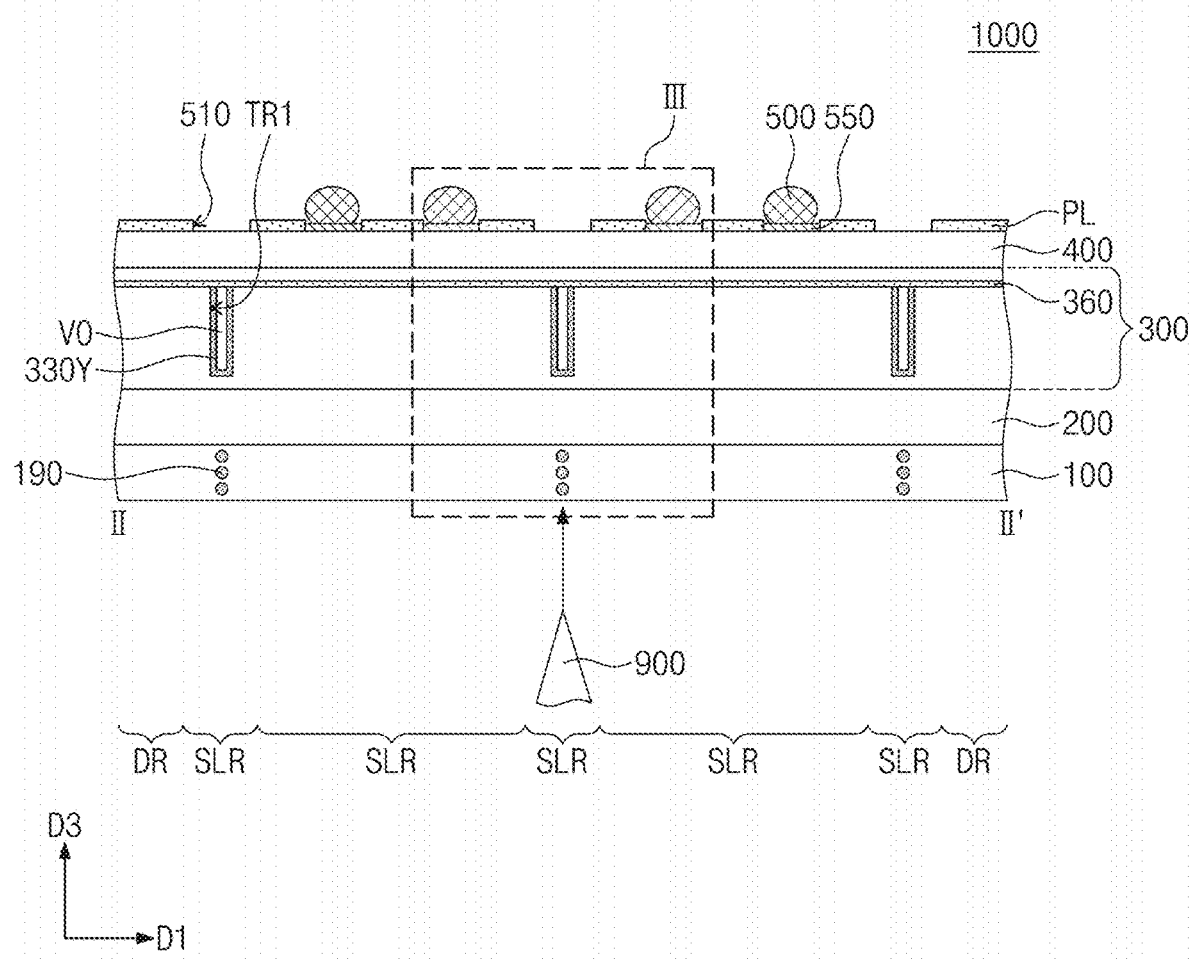

WAFER STRUCTURE AND SEMICONDUCTOR DEVICE

CROSS-REFERENCE TO RELATED APPLICATION

This U.S. nonprovisional application claims priority under 35 U.S.C § 119 to Korean Patent Application No. 10-2022-0020412, filed on Feb. 16, 2022 in the Korean Intellectual Property Office, the disclosure of which is hereby incorporated by reference in its entirety.

BACKGROUND

1. Field

Inventive concepts relate to a wafer structure and/or a semiconductor device fabricated using the same.

2. Description of the Related Art

The development of electronic industry may provide low price electronic products having characteristics such as light weight, compact size, high speed, and high performance. A wafer structure may be used in fabricating a semiconductor device. The wafer structure may include a plurality of device regions. The wafer structure may be diced to form semiconductor devices separated from each other. In a substrate dicing process, abnormal dicing of the wafer structure or damage to the semiconductor devices may occur.

SUMMARY

Some embodiments of inventive concepts provide a wafer dicing process in which semiconductor devices are satisfactorily separated from each other.

Some embodiments of inventive concepts provide a semiconductor device with increased reliability and/or a method of fabricating the same.

According to an embodiment of inventive concepts, a semiconductor device may include a substrate and a cell array structure on the substrate. The substrate may include a device region and a dummy region surrounding the device region in a plan view. The cell array structure may include a plurality of first dielectric layers, a plurality of gate structures, a vertical channel structure, and a dummy pattern. The vertical channel structure may be on the device region and may penetrate the plurality of gate structures and the plurality of first dielectric layers. The cell array structure includes an outer sidewall above an edge of the substrate and a recessed portion on the outer sidewall of the cell array structure. The dummy pattern may cover a sidewall of the recessed portion and a bottom surface of the recessed portion. The dummy pattern may include a material same as a material of the vertical channel structure.

According to an embodiment of inventive concepts, a semiconductor device may include a semiconductor substrate including a device region and a dummy region, the dummy region surrounding the device region in a plan view; a logic structure on the semiconductor substrate, the logic structure including a plurality of peripheral circuits; a cell array structure on the logic structure; a wiring layer on the cell array structure; a chip pad on the wiring layer; and a protection layer on the wiring layer and exposing the chip pad. The cell array structure may include an outer sidewall above an edge of the semiconductor substrate and a recessed portion on the outer sidewall of the cell array structure. The cell array structure may include a plurality of first dielectric layers on the device region and the dummy region of the semiconductor substrate and being vertically spaced apart from each other, a plurality of gate structures on the device region of the semiconductor substrate and interposed between the first dielectric layers, a plurality of second dielectric layers on the dummy region of the semiconductor substrate and interposed between the first dielectric layers, a vertical channel structure on the device region of the semiconductor substrate and penetrating the plurality of first dielectric layers and the plurality of gate structures, a conductive pad on the vertical channel structure, a dummy pattern on the dummy region of the semiconductor substrate and laterally spaced apart from the vertical channel structure, and a capping layer on a top surface of the vertical channel structure. The capping layer may extend onto the dummy region of the semiconductor substrate. The dummy pattern may cover a bottom surface of the recessed portion and a sidewall of the recessed portion. A height of the dummy pattern may be equal to a sum of a height of the vertical channel structure and a height of the conductive pad.

According to an embodiment of inventive concepts, a wafer structure may include a substrate including device region and a scribe lane region in a plan view; and a cell array structure on the substrate. The cell array structure may include a plurality of first dielectric layers vertically spaced apart from each other, a vertical channel structure, a dummy pattern, a first trench penetrating the plurality of first dielectric layers on the scribe lane region of the substrate, and a void in the first trench. The dummy pattern may cover a sidewall of the first trench and a bottom surface of the first trench.

BRIEF DESCRIPTION OF THE DRAWINGS

FIG. 2A illustrates an enlarged view showing section I of FIG. 1.

FIG. 3A illustrates a plan view showing a wafer structure according to some embodiments.

FIGS. 4A to 4J illustrate cross-sectional views showing a method of fabricating a wafer structure according to some embodiments.

FIGS. 5A and 6A illustrate cross-sectional views showing a dicing process according to some embodiments.

DETAILED DESCRIPTION

Figure 1:
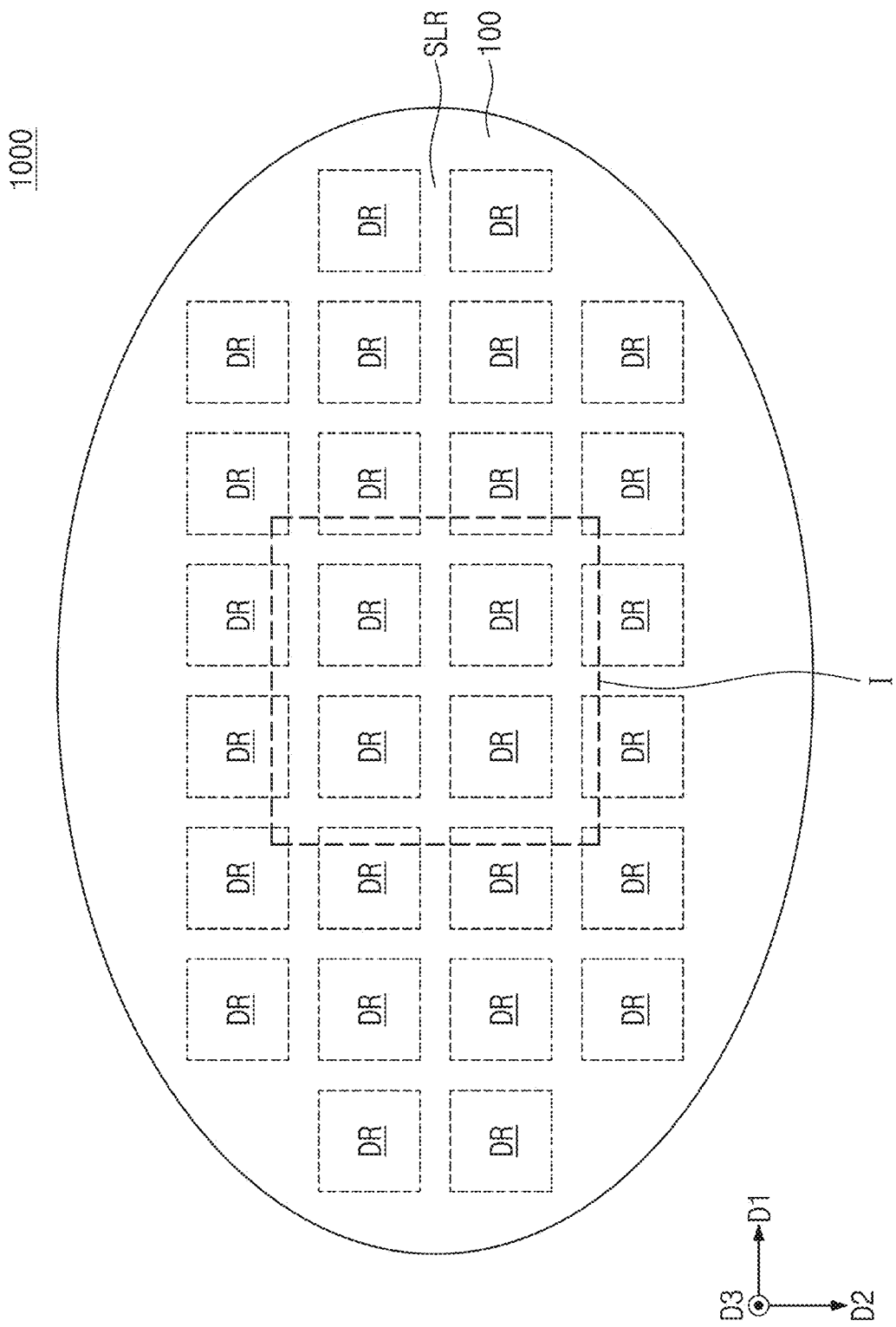
FIG. 1 illustrates a plan view showing a wafer structure according to some embodiments.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In this description, like reference numerals may indicate like components. The following will now describe wafer structures, semiconductor devices, semiconductor packages, and/or their fabrication methods.

Figure 2B:
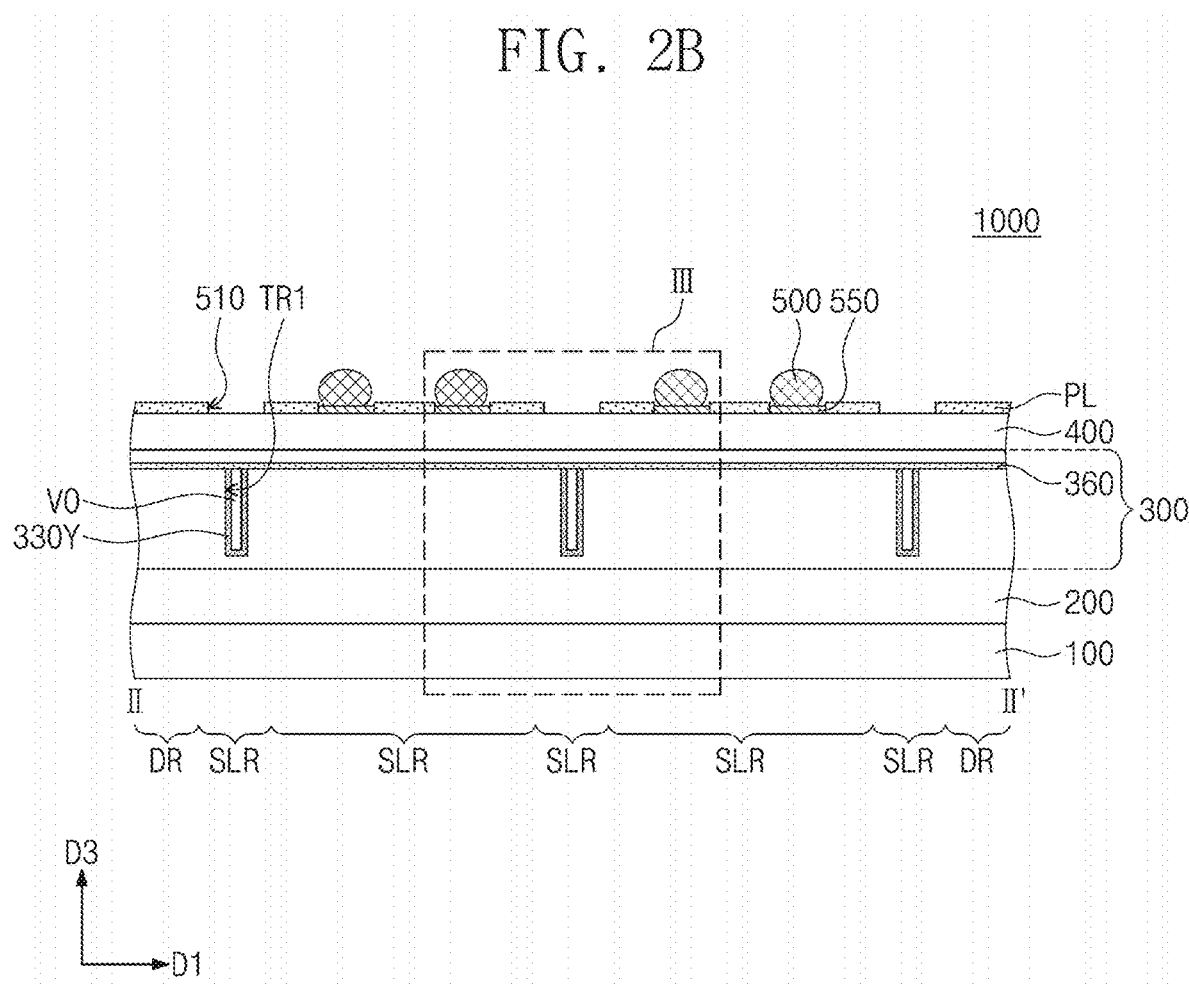
FIG. 2B illustrates a cross-sectional view taken along line II-II' of FIG. 2A.
Figure 2C:
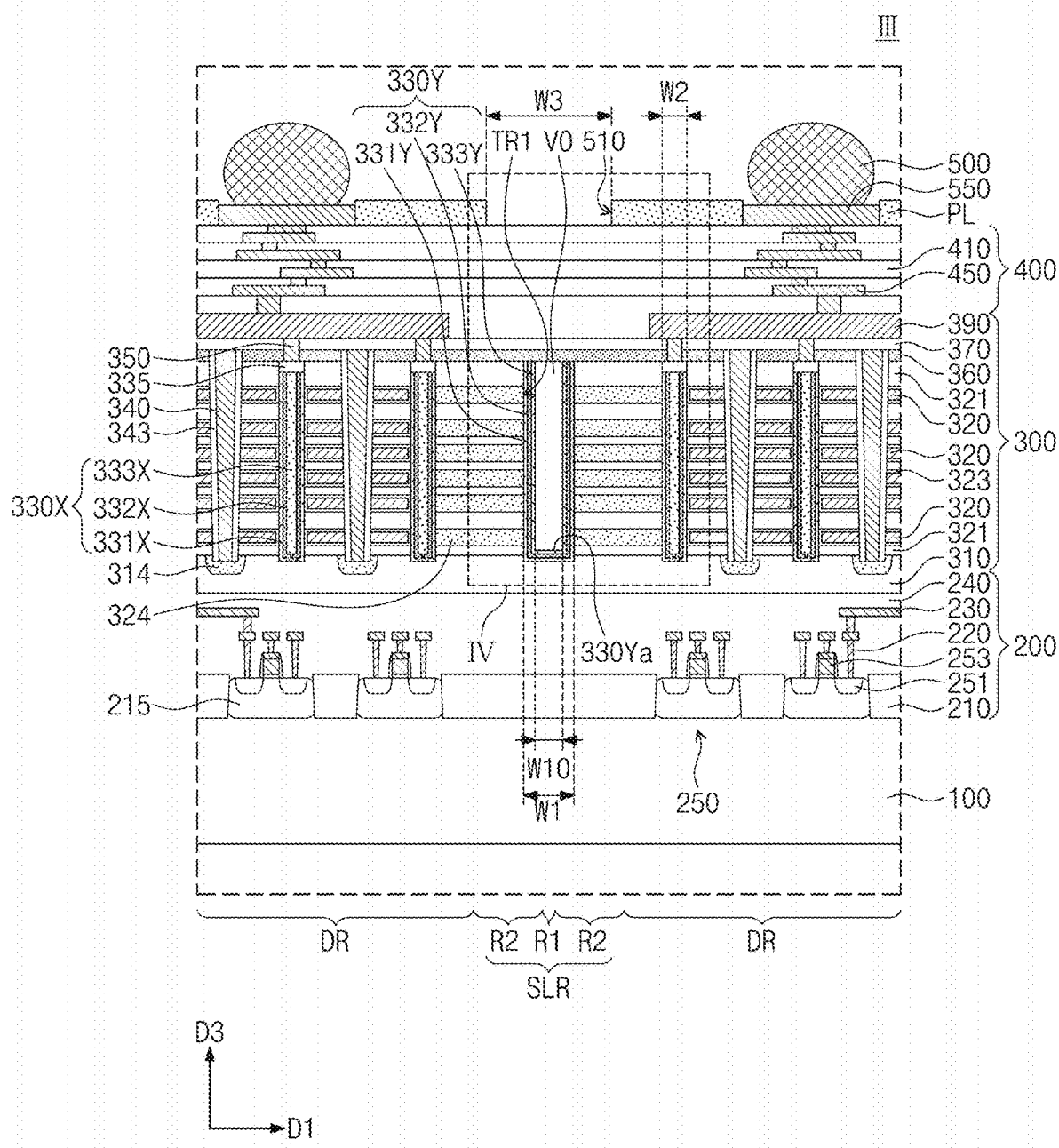
FIG. 2C illustrates an enlarged view showing section III of FIG. 2B.
Figure 2D:
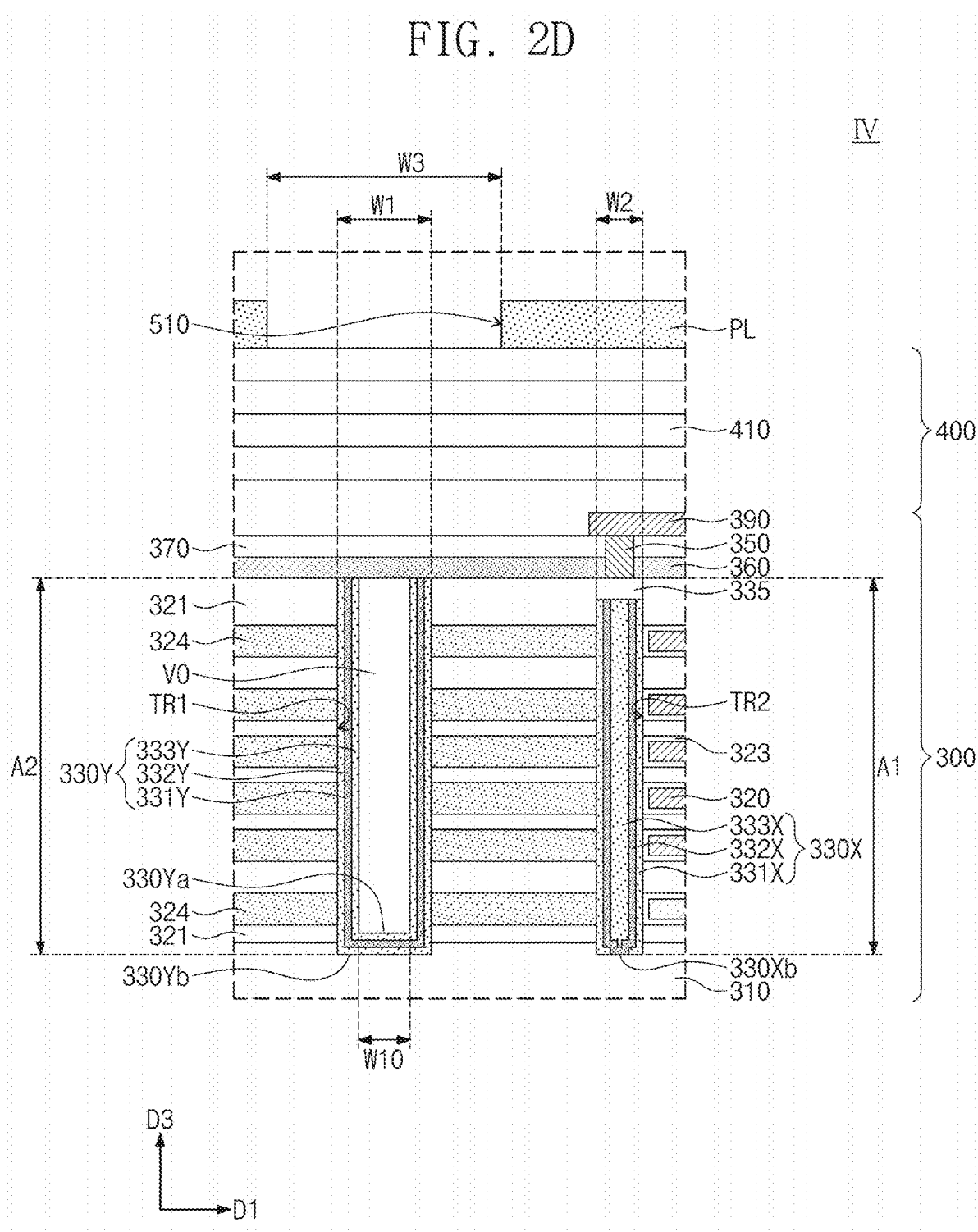
FIG. 2D illustrates an enlarged view showing section IV of FIG. 2C.

FIG. 1 illustrates a plan view showing a wafer structure according to some embodiments. FIG. 2A illustrates an enlarged view showing section I of FIG. 1. FIG. 2B illustrates a cross-sectional view taken along line II-II' of FIG. 2A. FIG. 2C illustrates an enlarged view showing section III of FIG. 2B. FIG. 2D illustrates an enlarged view showing section IV of FIG. 2C.

Referring to FIGS. 1 and 2A to 2D, a wafer structure 1000 may include a substrate 100, a logic structure 200, a cell array structure 300, a wiring layer 400, chip pads 550, and a protection layer PL. The logic structure 200 may be disposed between the substrate 100 and the cell array structure 300.

When viewed in plan, the substrate 100 may have device regions DR and a scribe lane region SLR. Each of the device regions DR may be an area that is used as a semiconductor substrate (see 10 of FIG. 7A or 7B). The device regions DR of the substrate 100 may be separated from each other by the scribe lane region SLR. The device regions DR may be separated from each other in a first direction D1 or a second direction D2. For example, the device regions DR may be arranged in rows along the first direction D1 and in columns along the second direction D2.

The first direction D1 may be parallel to a bottom surface of the substrate 100. The second direction D2 may be parallel to the bottom surface of the substrate 100 and may be substantially perpendicular to the first direction D1. A third direction D3 may be substantially perpendicular to the bottom surface of the substrate 100 and may intersect the first and second directions D1 and D2.

The scribe lane regions SLR may be disposed between the device regions DR of the substrate 100. The device regions DR may be surrounded by the scribe lane region SLR. The scribe lane region SLR may be an imaginary area. The scribe lane region SLR may include first sections and second sections. When viewed in plan, the first sections of the scribe lane region SLR may each extend in a direction parallel to the first direction D1, and the second sections of the scribe lane region SLR may each extend in a direction parallel to the second direction D2. The first sections of the scribe lane region SLR may be connected to the second sections of the scribe lane region SLR.

As illustrated in FIG. 2C, the scribe lane region SLR may include a dicing region R1 and a dummy region R2. The dicing region R1 of the scribe lane region SLR may be an area that is removed in a dicing process which will be discussed in FIGS. 5A and 6B. The dummy region R2 may be provided between the dicing region R1 and the device regions DR. The presence of the dummy region R2 may limit and/or prevent damage to components of the device regions DR in a dicing process.

The substrate 100 may be a semiconductor substrate. The substrate 100 may be a crystalline semiconductor substrate. For example, the substrate 100 may have a monocrystalline structure, but inventive concepts are not limited thereto. The substrate 100 may include one or more of silicon, germanium, and silicon-germanium.

The logic structure 200 may be disposed on a top surface of the substrate 100. The logic structure 200 may include a device isolation layer 210, peripheral circuits 250, well sections 215, conductive plugs 220, lower lines 230, and a lower buried dielectric layer 240. The logic structure 200 may further include a resistor and a capacitor.

The peripheral circuits 250 may be provided on the top surface of the substrate 100. The top surface of the substrate 100 may be a front surface of the substrate 100. The peripheral circuits 250 may include transistors. Each of the peripheral circuits 250 may include a gate electrode 253 and source/drain sections 251 on opposite sides of the gate electrode 253. The gate electrode 253 may include a conductive material. Each of the peripheral circuits 250 may further include a gate dielectric layer, and the gate dielectric layer may be disposed between the substrate 100 and the gate electrode 253.

The device isolation layer 210 and the well sections 215 may be provided on the substrate 100. The well sections 215 may be doped areas of the substrate 100, but inventive concepts are not limited thereto. The device isolation layer 210 may be provided between the well sections 215. The device isolation layer 210 may define active areas in the well sections 215. The well sections 215 may be correspondingly provided thereon with transistors. The source/drain sections 251 may be provided in the well sections 215, and may have their conductivity different from that of corresponding well sections 215.

The conductive plugs 220 may be disposed on and coupled to the source/drain sections 251 or the gate electrode 253. The conductive plugs 220 may include a conductive material, such as metal.

The lower lines 230 and the lower buried dielectric layer 240 may be provided on the device isolation layer 210 and the well sections 215. The lower lines 230 may be provided in the lower buried dielectric layer 240. The lower lines 230 may be electrically connected through the conductive plugs 220 to the peripheral circuits 250. The lower lines 230 may include a conductive material, such as metal. The lower buried dielectric layer 240 may be a single layer or a multiple layer. The lower buried dielectric layer 240 may include a silicon-based dielectric material. The silicon-based dielectric material may include, for example, one or more of silicon oxide, silicon nitride, and silicon oxynitride.

The peripheral circuits 250, the conductive plugs 220, and the lower lines 230 may be provided on the device regions DR of the substrate 100, but may not be provided on the scribe lane region SLR of the substrate 100. For example, when viewed in plan, the peripheral circuits 250, the conductive plugs 220, and the lower lines 230 may be spaced apart from the scribe lane region SLR of the substrate 100. The lower buried dielectric layer 240 may be provided on the device regions DR and the scribe lane region SLR of the substrate 100.

The cell array structure 300 may be disposed on the logic structure 200. For example, the cell array structure 300 may be disposed on the lower buried dielectric layer 240. The cell array structure 300 may overlap the device regions DR and the scribe lane region SLR of the substrate 100. As illustrated in FIGS. 2C and 2D, the cell array structure 300 may include a semiconductor layer 310, gate structures 320, vertical channel structures 330X, a capping layer, contact plugs 340, spacers 343, and a dummy pattern 330Y. The cell array structure 300 may have a first trench TR1 and a second trench TR2.

The semiconductor layer 310 may be disposed on the logic structure 200, covering the lower buried dielectric layer 240. The semiconductor layer 310 may include a semiconductor material, such as one or more of silicon (Si), germanium (Ge), and silicon-germanium (SiGe). The semiconductor layer 310 may include one or more of semiconductors doped with impurities having a first conductivity type and an intrinsic semiconductor doped with no impurities. The semiconductor layer 310 may have a monocrystalline structure or a polycrystalline structure. For example, the impurities having the first conductivity type may include a III-group element, such as boron. The first conductivity type may be a p-type.

The semiconductor layer 310 may have common source sections 314. For example, the common source sections 314 may be provided in the semiconductor layer 310 and on a top surface of the semiconductor layer 310. The common source sections 314 may be doped with impurities having a second conductivity type. The impurities having the second conductivity type may include a V-group element, such as arsenic or phosphorus. The second conductivity type may be an n-type. The common source sections 314 may be provided on the device regions DR of the substrate 100, but may not be provided on the scribe lane region SLR.

A stack structure may be provided on the semiconductor layer 310 and may extend in a direction parallel to the first direction D1. The stack structure may include gate structures 320, first dielectric layers 321, and second dielectric layers 324. The stack structure may be provided in plural. The stack structure of FIG. 2C may be one of the plurality of stack structures. The stack structures may be spaced apart from each other in the second direction D2. For brevity, a single stack structure will be further discussed below.

The first dielectric layers 321 may be vertically stacked on each other on the semiconductor layer 310. The first dielectric layers 321 may overlap the device regions DR and the scribe lane region SLR of the substrate 100. A lowermost first dielectric layer 321 may have a thickness less than those of other first dielectric layers 321. The thicknesses of the other first dielectric layers 321 may be the same as or different from each other. The first dielectric layers 321 may include a silicon-containing dielectric material. The silicon-containing dielectric material may include one or more of silicon oxide, silicon nitride, and silicon oxynitride. The first dielectric layers 321 may include a low-k dielectric material. The low-k dielectric material may have a dielectric constant less than that of a silicon oxide layer.

The gate structures 320 may be provided on the device regions DR of the substrate 100, but may not be provided on the scribe lane region SLR of the substrate 100. The gate structures 320 may be vertically stacked on each other on the semiconductor layer 310. In this description, the term "vertical" or "vertically" may mean "parallel to the third direction D3." The gate structures 320 may be correspondingly interposed between the first dielectric layers 321. The gate structures 320 may be used as a string selection line, a ground selection line, and word lines. For example, an uppermost one and a lowermost one of the stacked gate structures 320 may be respectively used as a string selection line and a ground selection line. Other gate structures 320 between the lowermost and uppermost gate structures 320 may be used as word lines. The gate structures 320 may include a conductive material, such as metal. For example, the gate structures 320 may include tungsten. When viewed in plan, the gate structures 320 may have their major axes parallel to the second direction D2. The gate structures 320 may be spaced apart from each other in the first direction D1.

The vertical channel structures 330X may be provided in the stack structure and may be disposed laterally spaced apart from each other. The phrase "certain components are laterally spaced apart from each other" may mean that "certain components are horizontally spaced apart from each other." The term "horizontal" or "horizontally" may indicate the meaning of "parallel to the bottom surface of the substrate 100." For example, the vertical channel structures 330X may be provided in the second trench TR2, and the second trench TR2 may penetrate the vertical channel structures 330X. For example, the second trench TR2 may penetrate the first dielectric layers 321 and the gate structures 320. A bottom surface of the second trench TR2 may be provided in the semiconductor layer 310. Therefore, bottom surfaces of the vertical channel structures 330X may be located at a level lower than that of the top surface of the semiconductor layer 310 and higher than that of a bottom surface of the semiconductor layer 310. A level of a certain component may indicate a vertical level, and a difference in level between two components may be measured in the third direction D3.

A description of a first lower dielectric pattern 331Y, a first semiconductor pattern 332Y, and a first upper dielectric pattern 333Y will be provided below in an explanation given on an example of the dummy pattern 330Y.

The vertical channel structures 330X and the second trench TR2 may overlap the device regions DR of the substrate 100. The vertical channel structures 330X and the second trench TR2 may not be provided on the scribe lane region SLR of the substrate 100. When viewed in plan, the vertical channel structures 330X and the second trench TR2 may be disposed spaced apart from the scribe lane region SLR of the substrate 100. Each of the vertical channel structures 330X may include a second lower dielectric pattern 331X, a second semiconductor pattern 332X, and a second upper dielectric pattern 333X. The second lower dielectric pattern 331X may cover sidewalls of the second trench TR2. The sidewalls of the second trench TR2 may include inner sidewalls of the first dielectric layers 321. The second lower dielectric pattern 331X may be provided on the inner sidewalls of the first dielectric layers 321 and inner sidewalls of the gate structures 320. The second lower dielectric pattern 331X may expose the top surface of the semiconductor layer 310. The second lower dielectric pattern 331X may include a single dielectric layer or a plurality of dielectric layers. The second lower dielectric pattern 331X may serve as a portion of a data storage layer for charge-trap flash memory transistor. For example, the second lower dielectric pattern 331X may include a silicon-based dielectric material or a high-k dielectric material.

The second semiconductor pattern 332X may be provided on the sidewalls of the second trench TR2 and may cover a second lower dielectric pattern 331X. The second semiconductor pattern 332X may extend onto the semiconductor layer 310 to partially contact the top surface of the semiconductor layer 310 exposed by the second trench TR2. The second semiconductor pattern 332X may have a pipe shape, a hollow cylindrical shape, or a cup shape in the second trench TR2. The second semiconductor pattern 332X may define an empty section on a central portion of the second trench TR2.

The second semiconductor pattern 332X may include, for example, silicon (Si), germanium (Ge), or a mixture thereof. The second semiconductor pattern 332X may have at least one selected from a monocrystalline structure, an amorphous structure, and a polycrystalline structure. The second semiconductor pattern 332X may further include doped impurities. Alternatively, the second semiconductor pattern 332X may be an intrinsic semiconductor doped with no impurities.

The second upper dielectric pattern 333X may be provided in the second trench TR2 to cover the second semiconductor pattern 332X. The second upper dielectric pattern 333X may fill the second trench TR2. For example, the second upper dielectric pattern 333X may fill an unoccupied portion of the second trench TR2. The second upper dielectric pattern 333X may include a silicon-containing dielectric material. The second upper dielectric pattern 333X may be formed of a dielectric material having excellent gap-fill characteristics. The second upper dielectric pattern 333X may be formed of, for example, one or more of a high-density plasma oxide layer, a spin-on-glass (SOG) layer, and a chemical vapor deposition (CVD) layer.

The cell array structure 300 may further include gate dielectric patterns 323. The gate dielectric patterns 323 may be interposed between the gate structures 320 and the first dielectric layers 321 and between the gate structures 320 and the vertical channel structures 330X. For example, each of the gate dielectric patterns 323 may be interposed between a corresponding gate structure 320 and a corresponding vertical channel structure 330X, and may extend onto top and bottom surfaces of the corresponding gate structure 320. The gate dielectric pattern 323 may include a high-k dielectric material. The high-k dielectric material may mean a material whose dielectric constant is greater than that of silicon oxide, and may include one or more of zirconium oxide, aluminum oxide, and hafnium oxide.

Conductive pads 335 may be correspondingly disposed on the vertical channel structures 330X. The conductive pads 335 may have their bottom surfaces at a higher level than that of a top surface of an uppermost gate structure 320. The conductive pads 335 may include a metallic material or an impurity-doped semiconductor material. Each of the conductive pads 335 may be provided in an upper portion of the second trench TR2. The second trench TR2 may have a depth (see A2 of FIG. 2D) may be substantially the same as a sum of a height of a corresponding vertical channel structure 330X and a height of a corresponding conductive pad 335.

The capping layer may be provided on the vertical channel structures 330X and the stack structure. A top surface of the stack structure may be a top surface of an uppermost first dielectric layer 321. The capping layer may include a first capping layer 360 and a second capping layer 370. The first capping layer 360 may cover top surfaces of the vertical channel structures 330X and the top surface of the uppermost first dielectric layer 321. For example, the first capping layer 360 may include a silicon-containing dielectric material.

Contact plugs 340 may be provided to penetrate the first dielectric layers 321, the gate structures 320, and the first capping layer 360. The contact plugs 340 may be laterally spaced apart from the vertical channel structures 330X. The contact plugs 340 may be correspondingly provided between the vertical channel structures 330X. The contact plugs 340 may be correspondingly disposed on and coupled to the common source sections 314. The contact plugs 340 may include a barrier layer and a metal layer. The barrier layer may cover sidewalls of the metal layer. The barrier layer may include, for example, at least one selected from tantalum (Ta), tantalum nitride (TaN), titanium (Ti), titanium nitride (TiN), tungsten (W), tungsten nitride (WN), and any combination thereof. The metal layer may include tungsten (W), aluminum (Al), titanium (Ti), tantalum (Ta), cobalt (Co), or copper (Cu). The contact plugs 340 may be common source plugs. When viewed in plan, the contact plugs 340 may have their major axes that extend parallel to the second direction D2.

Spacers 343 may cover sidewalls of the contact plugs 340. Each of the spacers 343 may be provided between the first dielectric layers 321 and a corresponding contact plug 340 and between the gate structures 320 and the corresponding contact plug 340. The spacers 343 may include a dielectric material. The spacers 343 may include a silicon-containing dielectric material, such as one or more of silicon oxide, silicon nitride, and silicon oxynitride. Alternatively, the spacers 343 may include a low-k dielectric material, and the low-k dielectric material may have a dielectric constant less than that of silicon oxide.

The second capping layer 370 may be disposed on the first capping layer 360 to cover top surfaces of the contact plugs 340. The second capping layer 370 may include a dielectric material. For example, the second capping layer 370 may include a silicon-containing dielectric material.

Upper conductive plugs 350 may be formed in the first capping layer 360 and the second capping layer 370. For example, each of the upper conductive plugs 350 may penetrate the second capping layer 370 and the first capping layer 360. The upper conductive plugs 350 may be provided on the conductive pads 335 to be coupled to the conductive pads 335. The upper conductive plugs 350 may be electrically connected through the conductive pads 335 to corresponding vertical channel structures 330X. The upper conductive plugs 350 may be bit-line contact plugs.

A conductive line 390 may be provided on the second capping layer 370 and the upper conductive plugs 350, thereby being coupled to the upper conductive plugs 350. When viewed in plan, the conductive line 390 may extend in the first direction D1. The upper conductive plugs 350 and the conductive lines 390 may include a conductive material, such as metal. The conductive lines 390 may be bit lines. The conductive line 390 of FIGS. 2C and 2D may be one of a plurality of conductive lines 390, and when viewed in plan, the plurality of conductive lines 390 may be spaced apart from each other in the second direction D2.

The vertical channel structures 330X, the contact plugs 340, the conductive pads 335, the upper conductive plugs 350, and the conductive lines 390 may be provided on the device regions DR of the substrate 100, but may not be provided on the scribe lane region SLR of the substrate 100. For example, when viewed in plan, the vertical channel structures 330X, the contact plugs 340, the conductive pads 335, the upper conductive plugs 350, and the conductive lines 390 may be spaced apart from the scribe lane region SLR of the substrate 100.

The following will describe in detail the cell array structure 300 on the scribe lane region SLR of the substrate 100 according to some embodiments.

The semiconductor layer 310, the first dielectric layers 321, the first capping layer 360, and the second capping layer 370 may be provided on the device regions DR and the scribe lane region SLR of the substrate 100. The second dielectric layers 324 and the dummy pattern 330Y may further be provided on the scribe lane region SLR of the substrate 100.

On the scribe lane region SLR of the substrate 100, the second dielectric layers 324 may be correspondingly interposed between the first dielectric layers 321. The second dielectric layers 324 may not be provided on the device regions DR of the substrate 100, but inventive concepts are not limited thereto. The second dielectric layers 324 may be disposed horizontally spaced apart from corresponding gate structures 320. For example, on one of the device regions DR, the second dielectric layers 324 may be disposed on a first side of an outermost one of the vertical channel structures 330X, and the gate structures 320 may be disposed on a second side of the outermost vertical channel structure 330X. The second side may be opposite to the first side of the outermost vertical channel structure 330X. The second dielectric layers 324 may include a material different from that of the first dielectric layers 321. For example, the first dielectric layers 321 may include silicon oxide, and the second dielectric layers 324 may include silicon nitride.

The first trench TR1 may be provided on the scribe lane region SLR of the substrate 100, but may not be provided on the device regions DR of the substrate 100. As illustrated in FIG. 2A, the first trench TR1 may have a grid shape when viewed in plan. For example, when viewed in plan, the first trench TR1 may include first sub-trenches and second sub-trenches. The first sub-trenches may extend parallel to the first direction D1 and may be spaced apart from each other in the second direction D2. The second sub-trenches may extend parallel to the second direction D2 and may be spaced apart from each other in the first direction D1. The second sub-trenches may be spatially connected to the first sub-trenches. When viewed in plan, the first trench TR1 may surround the device regions DR of the substrate 100.

As illustrated in FIGS. 2C and 2D, the first trench TR1 may be provided on the dicing region R1 and the dummy region R2 of the substrate 100. The first trench TR1 may penetrate the first dielectric layers 321 and the second dielectric layers 324. The first trench TR1 may expose sidewalls of the first dielectric layers 321, sidewalls of the second dielectric layers 324, and the substrate 100. The first trench TR1 may have a bottom surface provided in the semiconductor layer 310. For example, the bottom surface of the first trench TR1 may be located at a level lower than that of the top surface of the semiconductor layer 310 and higher than that of the bottom surface of the semiconductor layer 310. However, there may be a large variation in level of the bottom surface of the first trench TR1. The first trench TR1 may be disposed laterally spaced apart from the vertical channel structures 330X. The bottom surface of the first trench TR1 may be a recessed inner surface of the semiconductor layer 310.

The bottom surface of the first trench TR1 may be located at substantially the same level as that of the bottom surface of the second trench TR2. As illustrated in FIG. 2D, the first trench TR1 may have a depth A1 substantially the same as a depth A2 of the second trench TR2. The phrase "certain components are the same in terms of width, depth, height, and level" may include an allowable tolerance possibly occurring during fabrication process. The depth A1 of the first trench TR1 may range, for example, from about 8 μm to about 20 μm. The depth A2 of the second trench TR2 may range, for example, from about 8 μm to about 20 μm.

The first trench TR1 may have a width W1 greater than a width W2 of the second trench TR2. The width W1 of the first trench TR1 may range, for example, from about 10 nm to about 100 nm. As the width W1 of the first trench TR1 is greater than about 10 nm, the first trench TR1 may be provided therein with a void VO, which will be discussed below.

The dummy pattern 330Y may be provided on the bottom surface and a sidewall of the first trench TR1. The dummy pattern 330Y may have a U-shaped cross section. The dummy pattern 330Y may conformally cover the bottom surface and the sidewall of the first trench TR1. For example, a thickness of the dummy pattern 330Y on the bottom surface of the first trench TR1 may be the same as or similar to that of the dummy pattern 330Y on the sidewall of the first trench TR1. The dummy pattern 330Y may not be provided on the device regions DR of the substrate 100. The dummy pattern 330Y may be laterally spaced apart from the vertical channel structures 330X. The dummy pattern 330Y may include a material the same as that of the vertical channel structures 330X. A height of the dummy pattern 330Y may be substantially the same as the depth A1 of the first trench TR1. The height of the dummy pattern 330Y may be substantially the same as a sum of a height of one of the vertical channel structures 330X and a height of a corresponding conductive pad 335. The sum of a height of one of the vertical channel structures 330X and a height of a corresponding conductive pad 335 may be substantially the same as the depth A2 of the second trench TR2.

As illustrated in FIG. 2D, a bottom surface 330Yb of the dummy pattern 330Y may be located at substantially the same level as that of bottom surfaces 330Xb of the vertical channel structures 330X. The bottom surface 330Yb of the dummy pattern 330Y may correspond to the bottom surface of the first trench TR1, the bottom surfaces 330Xb of the vertical channel structures 330X may correspond to the bottom surface of the second trench TR2.

The dummy pattern 330Y may include a first lower dielectric pattern 331Y, a first semiconductor pattern 332Y, and a first upper dielectric pattern 333Y. The first lower dielectric pattern 331Y may cover the bottom surface and the sidewall of the first trench TR1. The first lower dielectric pattern 331Y may include a silicon-based dielectric material or a high-k dielectric material. The first lower dielectric pattern 331Y may include a material the same as that of the second lower dielectric pattern 331X. A thickness of the first lower dielectric pattern 331Y may be substantially the same as that of the second lower dielectric pattern 331X.

The first semiconductor pattern 332Y may be provided on the bottom surface and the sidewall of the first trench TR1, and may cover the first lower dielectric pattern 331Y. The first semiconductor pattern 332Y may include one of the materials discussed in the example of the second semiconductor pattern 332X. For example, the first semiconductor pattern 332Y may include a material the same as that of the second semiconductor pattern 332X. A thickness of the first semiconductor pattern 332Y may be substantially the same as that of the second semiconductor pattern 332X.

The first upper dielectric pattern 333Y may be provided on the bottom surface and the sidewall of the first trench TR1, and may cover the first semiconductor pattern 332Y. The first upper dielectric pattern 333Y may include a silicon-containing dielectric material. The first upper dielectric pattern 333Y may include a material the same as that of the second upper dielectric pattern 333X. A thickness of the first upper dielectric pattern 333Y may be substantially the same as that of the second upper dielectric pattern 333X.

The first capping layer 360 may close an entrance of the first trench TR1. A bottom surface of the first capping layer 360 may be vertically spaced apart from a top surface 330Ya of the dummy pattern 330Y on the bottom surface of the first trench TR1. The bottom surface of the first capping layer 360 may be spaced apart from a sidewall of the dummy pattern 330Y on the sidewall of the first trench TR1. Therefore, the void VO may be provided in the first trench TR1. The void VO may be a space that is surrounded by the dummy pattern 330Y and the first capping layer 360. For example, the void VO may be a space between the top surface 330Ya of the dummy pattern 330Y on the bottom surface of the first trench TR1, the sidewall of the dummy pattern 330Y on the sidewall of the first trench TR1, and the bottom surface of the first capping layer 360. The void VO may be an empty space in a vacuum state or occupied by air.

As illustrated in FIG. 2D, the void VO may have a width W10 and a height that are less than the width W1 and the depth A1 of the first trench TR1. When viewed in plan, the void VO may surround the device regions DR of the substrate 100.

The void VO may be provided on the scribe lane region SLR of the substrate 100, but may not be provided on the device regions DR of the substrate 100. For example, when viewed in plan, the void VO may be provided on the dicing region (see R1 of FIGS. 2C and 2D) and the dummy region (see R2 of FIGS. 2C and 2D) of the substrate 100.

When viewed in plan view as shown in FIG. 2A, a shape and arrangement of the void VO may be similar to that of the first trench TR1. For example, the void VO may have a grid shape when viewed in plan. When viewed in plan, the void VO may have portions that extend in the first direction D1 and portions that extend in the second direction D2.

Although not shown, the wafer structure 1000 may further include a connection conductive structure. The connection conductive structure may be coupled to one of the conductive lines 390 and to one of the lower lines 230. Therefore, the cell array structure 300 may be electrically connected to the logic structure 200. The phrase "electrically connected to the logic structure 200" may mean that "electrically connected to the peripheral circuits 250." The expression "electrically connected to the cell array structure 300" may mean that "electrically connected to at least one selected from the gate structures 320 and the conductive lines 390." The language "electrically connected to" may include the meaning of "directly connected to" and "indirectly connected through other component(s)."

The wiring layer 400 may be disposed on the conductive line 390. The wiring layer 400 may include a front-end-of-line (FEOL) layer and a back-end-of-line (BEOL) layer. The wiring layer 400 may include upper dielectric layers 410 and conductive patterns 450. The upper dielectric layers 410 may be stacked on the conductive line 390. The upper dielectric layers 410 may include a silicon-containing dielectric material.

The conductive patterns 450 may include wiring patterns and via patterns. The wiring patterns may be interposed between the upper dielectric layers 410. Each of the via patterns may penetrate a corresponding one of the upper dielectric layers 410. The via patterns may be interposed between and electrically connected to the wiring patterns. The conductive patterns 450 may include metal, such as copper or tungsten. The conductive patterns 450 may be electrically connected to corresponding conductive lines 390. The conductive patterns 450 may be provided on the device regions DR of the substrate 100.

The chip pads 550 may be disposed on a top surface of the wiring layer 400. The chip pads 550 may be electrically connected to the conductive patterns 450. The chip pads 550 may be laterally spaced apart and electrically connected to each other. The chip pads 550 may include, for example, aluminum. Alternatively, the chip pads 550 may include metal, such as nickel, gold, copper, or tungsten. The chip pads 550 may be provided on the device regions DR of the substrate 100, but may not be provided on the scribe lane region SLR of the substrate 100.

The wafer structure 1000 may further include solder balls 500. The solder balls 500 may be provided on corresponding chip pads 550. The solder balls 500 may include a solder material, such as tin, lead, silver, or an alloy thereof.

The protection layer PL may be disposed on the top surface of the wiring layer 400. The protection layer PL may cover the top surface of the wiring layer 400 and may expose the chip pads 550. The protection layer PL may include a material different from that of the upper dielectric layers 410. For example, the protection layer PL may include a dielectric polymer such as polyimide or photosensitive polyimide (PSPI).

An opening 510 may be provided on the scribe lane region SLR of the substrate 100. The protection layer PL may have the opening 510. The opening 510 may penetrate the protection layer PL. The opening 510 may expose the top surface of the wiring layer 400. For example, the opening 510 may expose a top surface of an uppermost one of the upper dielectric layers 410. For example, the opening 510 may expose the top surface of the wiring layer 400 on the scribe lane region SLR of the substrate 100. The opening 510 may define the scribe lane region SLR of the substrate 100. For example, the opening 510 may be provided on the dicing region R1 of the substrate 100. The opening 510 may further extend onto the dummy region R2 of the substrate 100. The opening 510 may have a width W3 greater than the width W1 of the first trench TR1 and greater than the width W10 of the void VO.

The opening 510 may have a grid shape when viewed in plan. For example, the opening 510 may include first openings and second openings. The first openings may extend parallel to the first direction D1 and may be spaced apart from each other in the second direction D2. The second openings may extend parallel to the second direction D2 and may be spaced apart from each other in the first direction D1. The second openings may be spatially connected to the first openings.

Figure 2E:
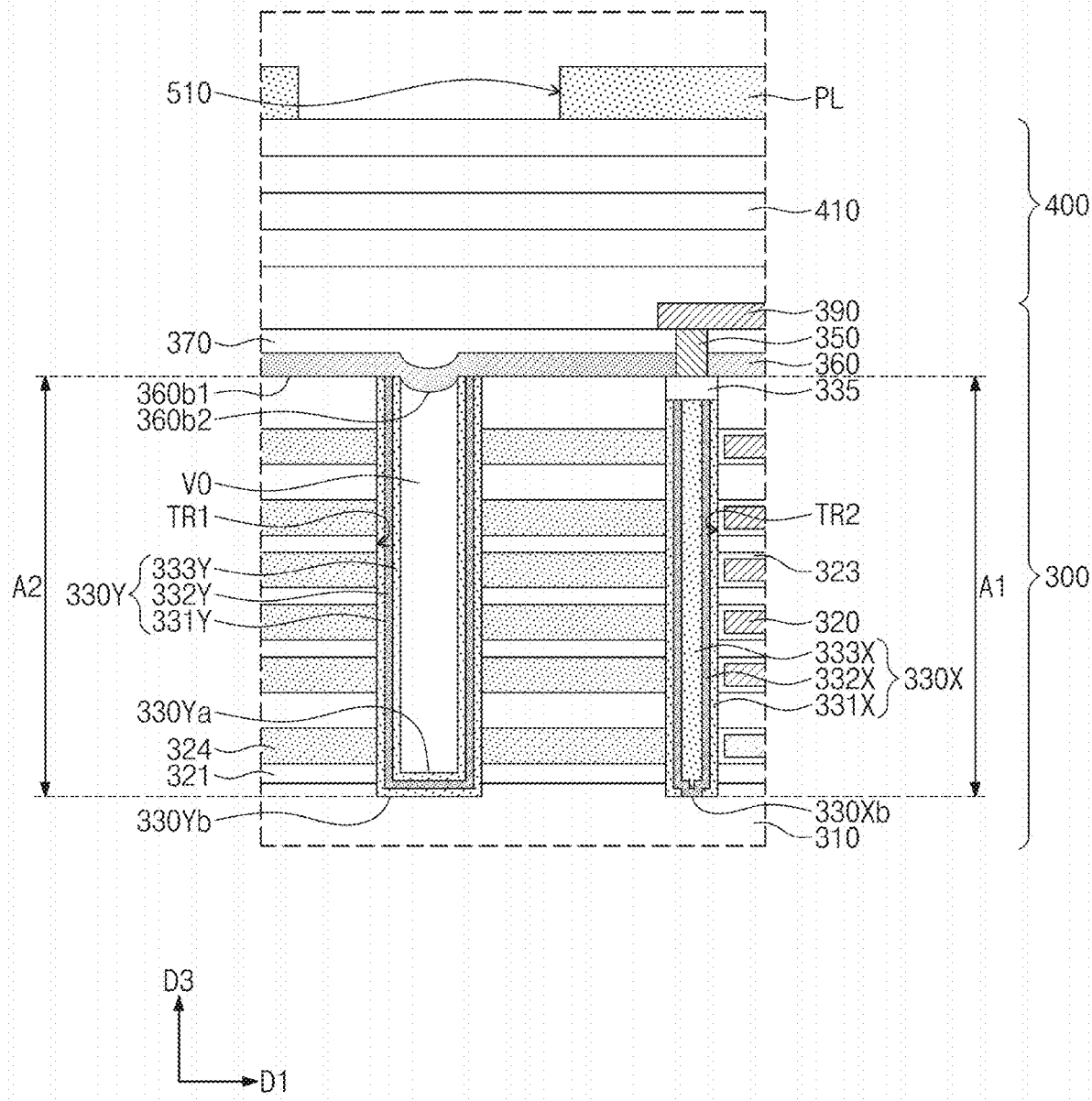
FIG. 2E illustrates a cross-sectional view showing a void according to some embodiments.

FIG. 2E illustrates a cross-sectional view showing a void according to some embodiments. A duplicate description will be omitted below.

Referring to FIG. 2E, the first capping layer 360 may close an entrance of the first trench TR1, and the void VO may be provided in the first trench TR1. In this case, the first capping layer 360 may further extend into an upper portion of the first trench TR1. For example, the first capping layer 360 may include a protrusion, and the protrusion may extend into the upper portion of the first trench TR1. The first capping layer 360 may have a first bottom surface 360b1 and a second bottom surface 360b2. The first bottom surface 360b1 of the first capping layer 360 may be disposed on the uppermost first dielectric layer 321. The second surface 360b2 of the first capping layer 360 may be connected to the first bottom surface 360b1 of the first capping layer 360, and may be provided on or in the first trench TR1. For example, the second bottom surface 360b2 of the first capping layer 360 may overlap the void VO. The second bottom surface 360b2 of the first capping layer 360 may be located at a level lower than that of the first bottom surface 360b1 of the first capping layer 360. The second bottom surface 360b2 of the first capping layer 360 may be a bottom surface of the protrusion.

Figure 3B:
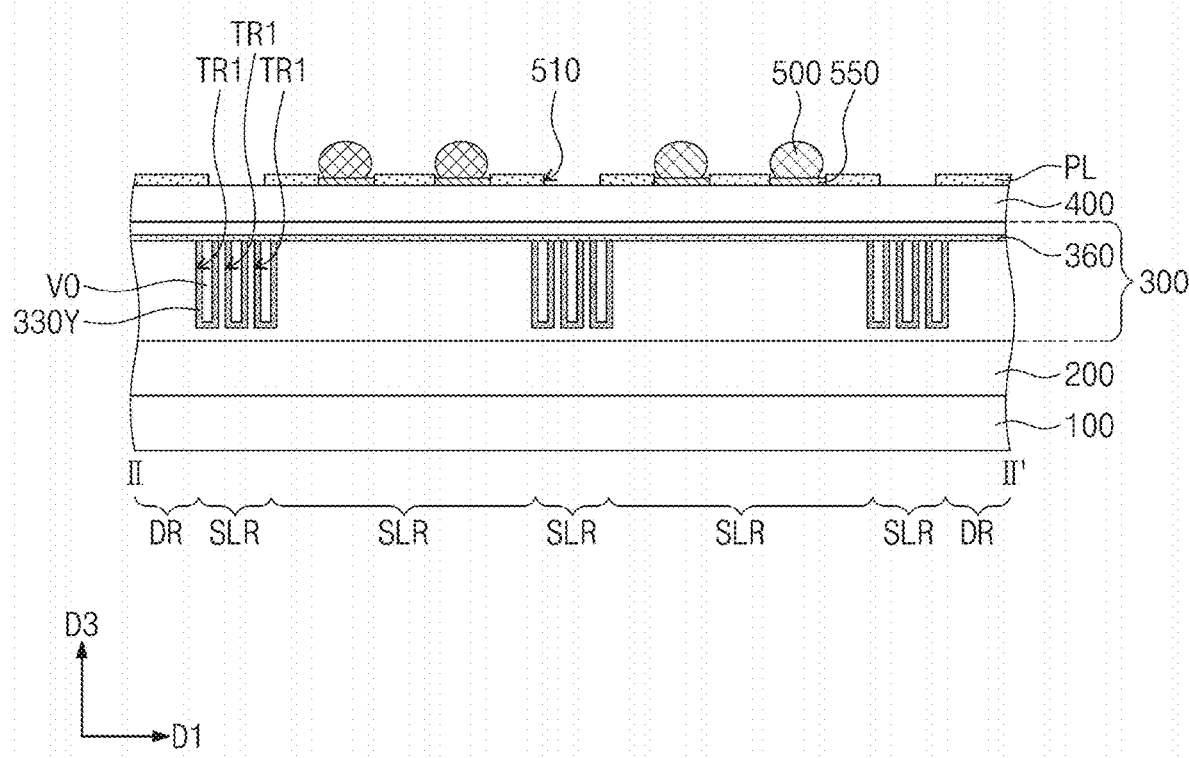
FIG. 3B illustrates a cross-sectional view taken along line II-II' of FIG. 3A.

FIG. 3A illustrates an enlarged view of section I depicted in FIG. 1, showing a wafer structure according to some embodiments. FIG. 3B illustrates a cross-sectional view taken along line II-II' of FIG. 3A.

Referring to FIGS. 3A and 3B, the wafer structure 1000 may include a substrate 100, a logic structure 200, a cell array structure 300, a wiring layer 400, chip pads 550, and a protection layer PL.

The cell array structure 300 may have a plurality of first trenches TR1. Each of the first trenches TR1 may be provided on the scribe lane region SLR of the substrate 100 discussed in the examples of FIGS. 2A to 2D. The first capping layer 360 may close entrances of the first trenches TR1, and thus a plurality of voids VO may be correspondingly provided in the first trenches TR1. The cell array structure 300 may include a plurality of dummy patterns 330Y. The dummy patterns 330Y may cover bottom surfaces and sidewalls of the first trenches TR1. The dummy patterns 330Y may be laterally spaced apart from each other, but inventive concepts are not limited thereto. At least one of the first trenches TR1, at least one of the voids VO, and at least one of the dummy patterns 330Y may vertically overlap the dicing region R1 discussed above in the example of FIG. 2C.

For brevity, the following will describe in detail a single first trench TR1, a single void VO, and a single dummy pattern 330Y, but inventive concepts are not limited thereto.

The following will describe a method of fabricating a wafer structure according to some embodiments.

FIGS. 4A to 4J illustrate enlarged cross-sectional views of section III of FIG. 2A, showing a method of fabricating a wafer structure according to some embodiments. A duplicate description will be omitted below.

Figure 4A:
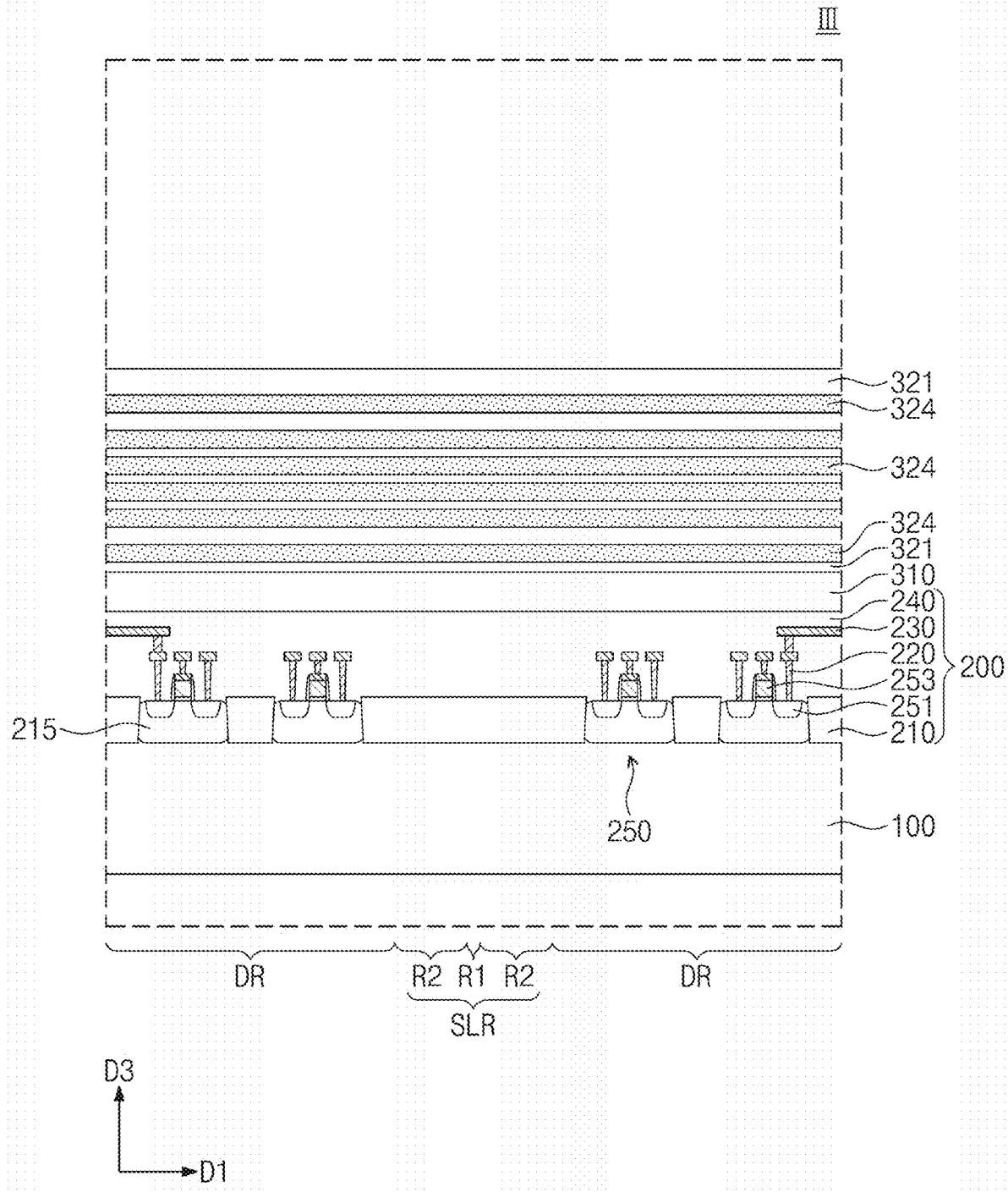

Referring to FIG. 4A, a logic structure 200 may be formed on a substrate 100. The logic structure 200 may be substantially the same as that discussed in the examples of FIGS. 2B to 2D.

A semiconductor layer 310 may be formed on the logic structure 200. A first dielectric layer 321 may be formed on the semiconductor layer 310, and a second dielectric layer 324 may be formed on the first dielectric layer 321. The first dielectric layer 321 and the second dielectric layer 324 may be repeatedly formed to form first dielectric layers 321 and second dielectric layers 324 that are alternately stacked. A lowermost first dielectric layer 321 may be provided between the semiconductor layer 310 and a lowermost second dielectric layer 324. An uppermost first dielectric layer 321 may be provided on an uppermost second dielectric layer 324. Portions of the second dielectric layers 324 may serve as sacrificial layers.

Figure 4B:
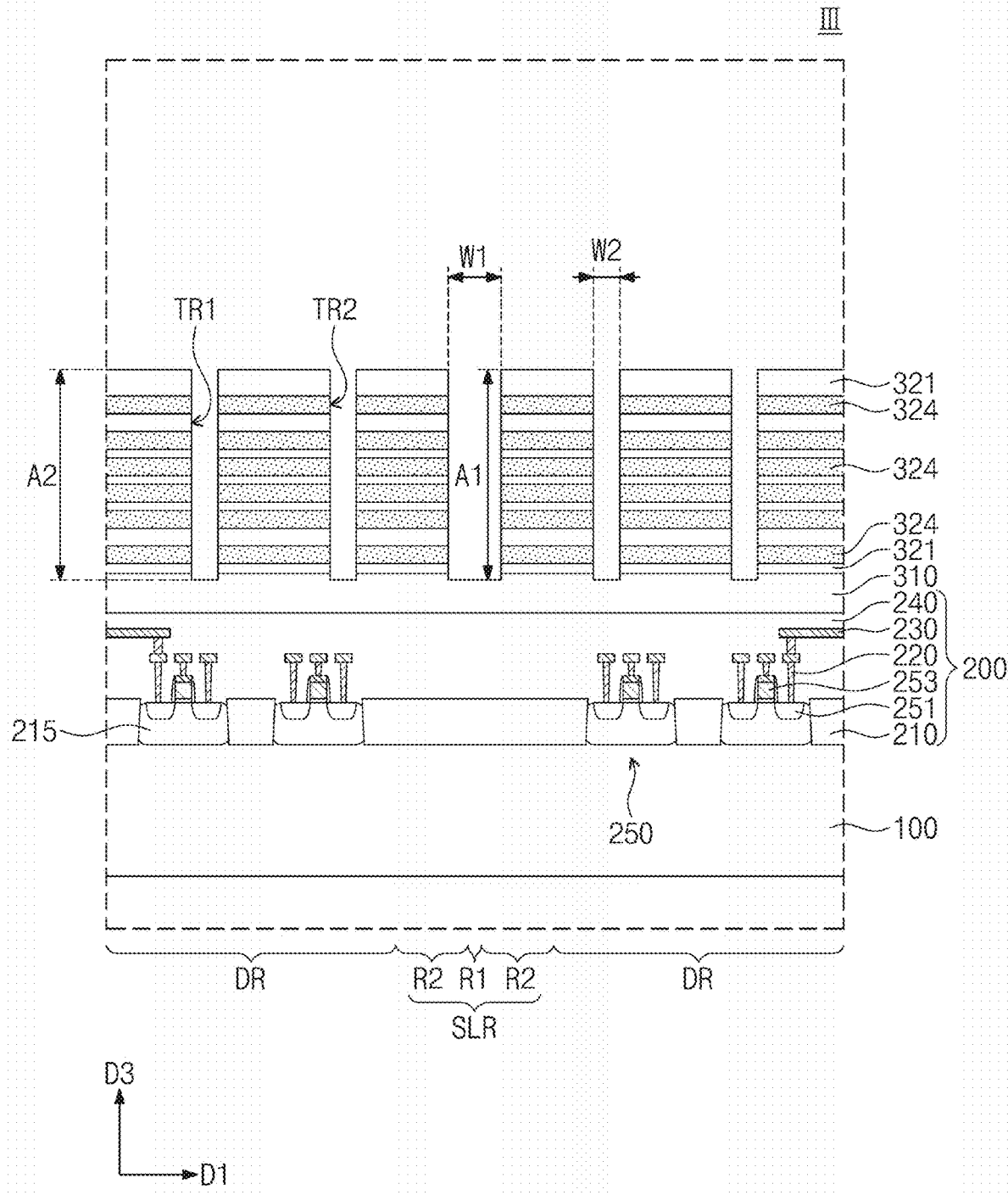

Referring to FIG. 4B, a first trench TR1 and a second trench TR2 may be formed. The first trench TR1 may be formed on a scribe lane region SLR of the substrate 100, and may penetrate the first dielectric layers 321 and the second dielectric layers 324. The second trench TR2 may include a plurality of second trenches TR2 that are spaced apart from each other. The second trenches TR2 may be formed on device regions DR of the substrate 100, and may penetrate the first dielectric layers 321 and the second dielectric layers 324. The first trench TR1 and the second trenches TR2 may each expose the substrate 100. A single process may be performed to form the first trench TR1 and the second trenches TR2. For example, a single etching process may be employed to form the first trench TR1 and the second trenches TR2. Therefore, a depth A1 of the first trench TR1 may be substantially the same as depths A2 of the second trenches TR2. A width W1 of the first trench TR1 may be greater than a width W2 of the second trench TR2.

Figure 4C:
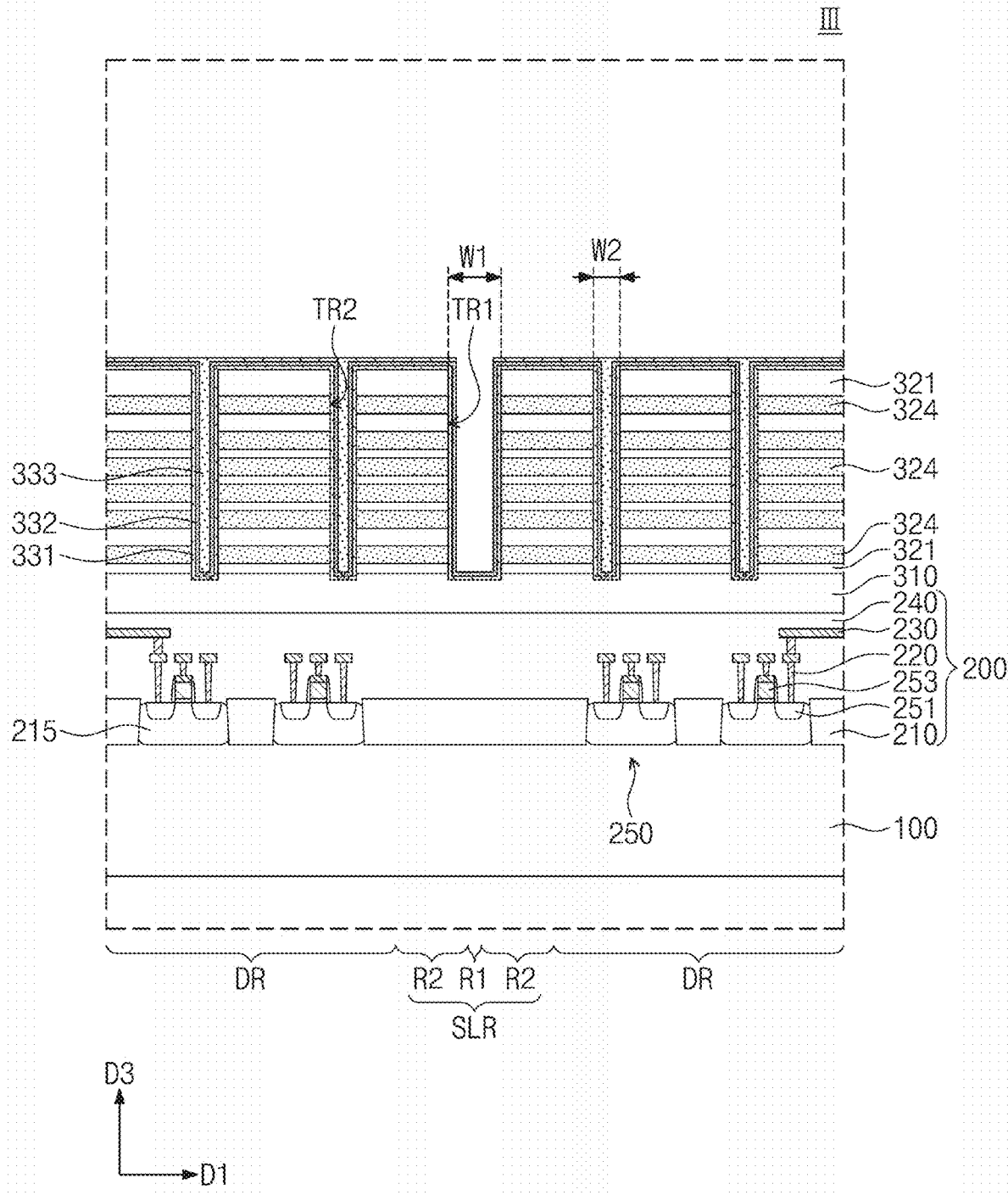

Referring to FIG. 4C, a lower dielectric layer 331, a semiconductor pattern 332, and an upper dielectric layer 333 may be formed on the uppermost first dielectric layer 321, and may extend into the first trench TR1 and the second trenches TR2.

According to some embodiments, the lower dielectric layer 331 may be formed on the uppermost first dielectric layer 321, and may cover a bottom surface and sidewalls of the first trench TR1 and may also cover bottom surfaces and sidewalls of the second trenches TR2. The lower dielectric layer 331 may be formed by a deposition process. The lower dielectric layer 331 may include, for example, a silicon-based dielectric material or a high-k dielectric material.

The semiconductor pattern 332 may be formed on the uppermost first dielectric layer 321 and may cover the lower dielectric layer 331. The semiconductor pattern 332 may extend onto the bottom surface and the sidewalls of the first trench TR1 and onto the bottom surfaces and the sidewalls of the second trenches TR2, thereby conformally covering the lower dielectric layer 331. The semiconductor pattern 332 may be formed by a deposition process, such as thermal chemical vapor deposition (CVD), plasma enhanced CVD, physical CVD, or atomic layer deposition (ALD).

The upper dielectric layer 333 may be formed on the uppermost first dielectric layer 321 and may cover the semiconductor pattern 332. The upper dielectric layer 333 may extend into the first trench TR1 and the second trenches TR2. As the second trenches TR2 have their relatively small width W2, the upper dielectric layer 333 may fill unoccupied portions of the second trenches TR2.

The upper dielectric layer 333 may extend onto the sidewall and the bottom surface of the first trench TR1. The width W1 of the first trench TR1 may be relatively large. For example, the width W1 of the first trench TR1 may be greater than the width W2 of the second trenches TR2. Therefore, the upper dielectric layer 333 may not fill the first trench TR1. The upper dielectric layer 333 may have a U-shaped cross section in the first trench TR1. For example, the upper dielectric layer 333 may conformally cover the semiconductor pattern 332 on the bottom surface and the sidewall of the first trench TR1. After the upper dielectric layer 333 is formed, an empty space may be provided in the first trench TR1.

Figure 4D:
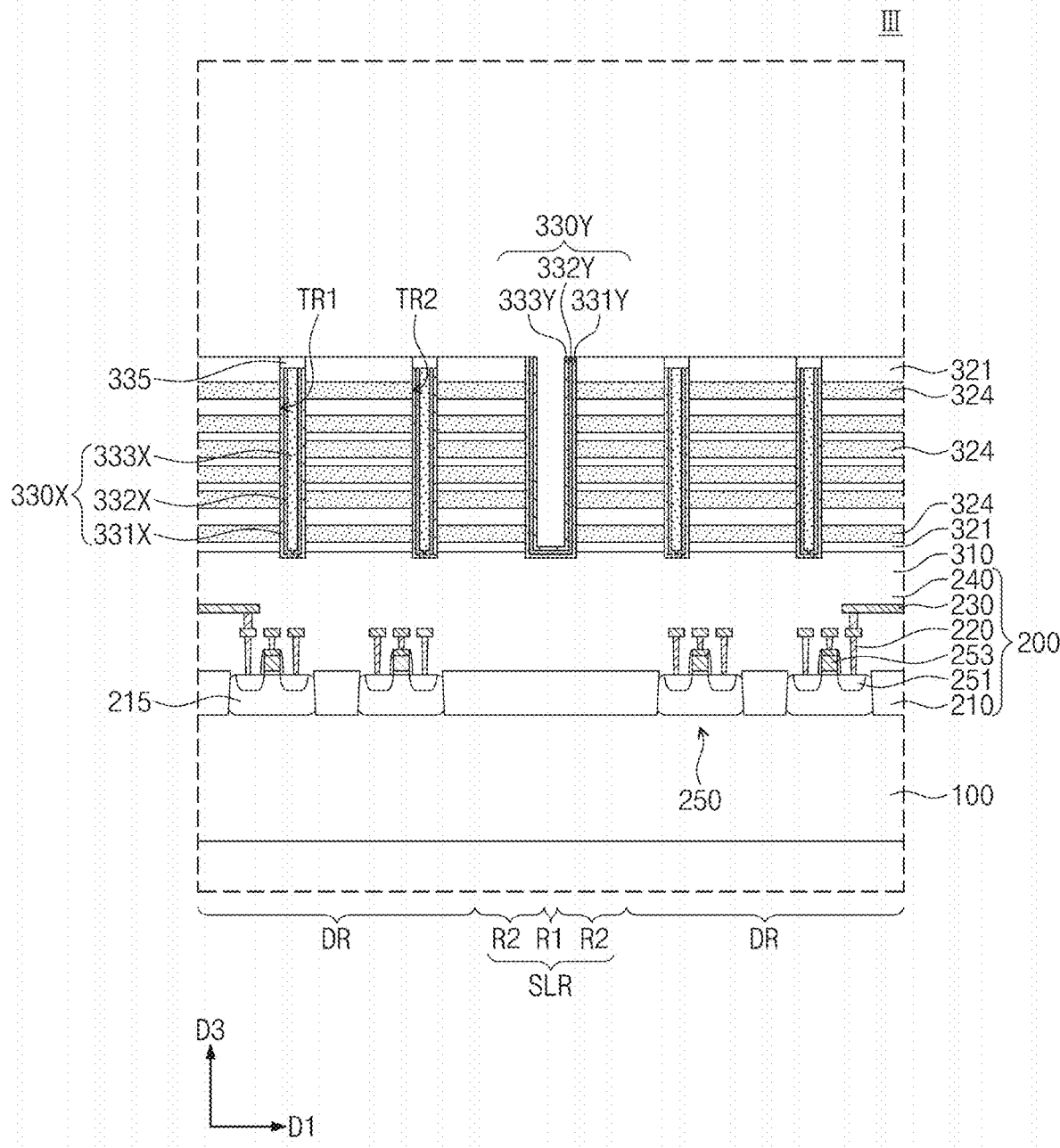

Referring to FIG. 4D, the upper dielectric layer 333 may be patterned to form a first upper dielectric pattern 333Y and a second upper dielectric pattern 333X. The first and second upper dielectric patterns 333Y and 333X may be separated from each other.

The semiconductor layer 310 may be patterned to form a first semiconductor pattern 332Y and a second semiconductor pattern 332X. The first and second semiconductor patterns 332Y and 332X may be separated from each other.

The lower dielectric layer 331 may be patterned to form a first lower dielectric pattern 331Y and a second lower dielectric pattern 331X. The patterning of the lower dielectric layer 331 may expose a top surface of the uppermost first dielectric layer 321. Therefore, vertical channel structures 330X and a dummy pattern 330Y may be formed. The dummy pattern 330Y may include a first lower dielectric pattern 331Y, a first semiconductor pattern 332Y, and a first upper dielectric pattern 333Y. The first lower dielectric pattern 331Y, the first semiconductor pattern 332Y, and the first upper dielectric pattern 333Y may be provided in a corresponding first trench TR1.

Each of the vertical channel structures 330X may include a second lower dielectric pattern 331X, a second semiconductor pattern 332X, and a second upper dielectric pattern 333X. The second lower dielectric pattern 331X, the second semiconductor pattern 332X, and the second upper dielectric pattern 333X may be provided in a corresponding second trench TR2. The second lower dielectric pattern 331X, the second semiconductor pattern 332X, and the second upper dielectric pattern 333X may not be provided on an upper portion of the corresponding second trench TR2.

Conductive pads 335 may be formed on upper portions of the second trenches TR2 to cover top surfaces of the vertical channel structures 330X.

Figure 4E:
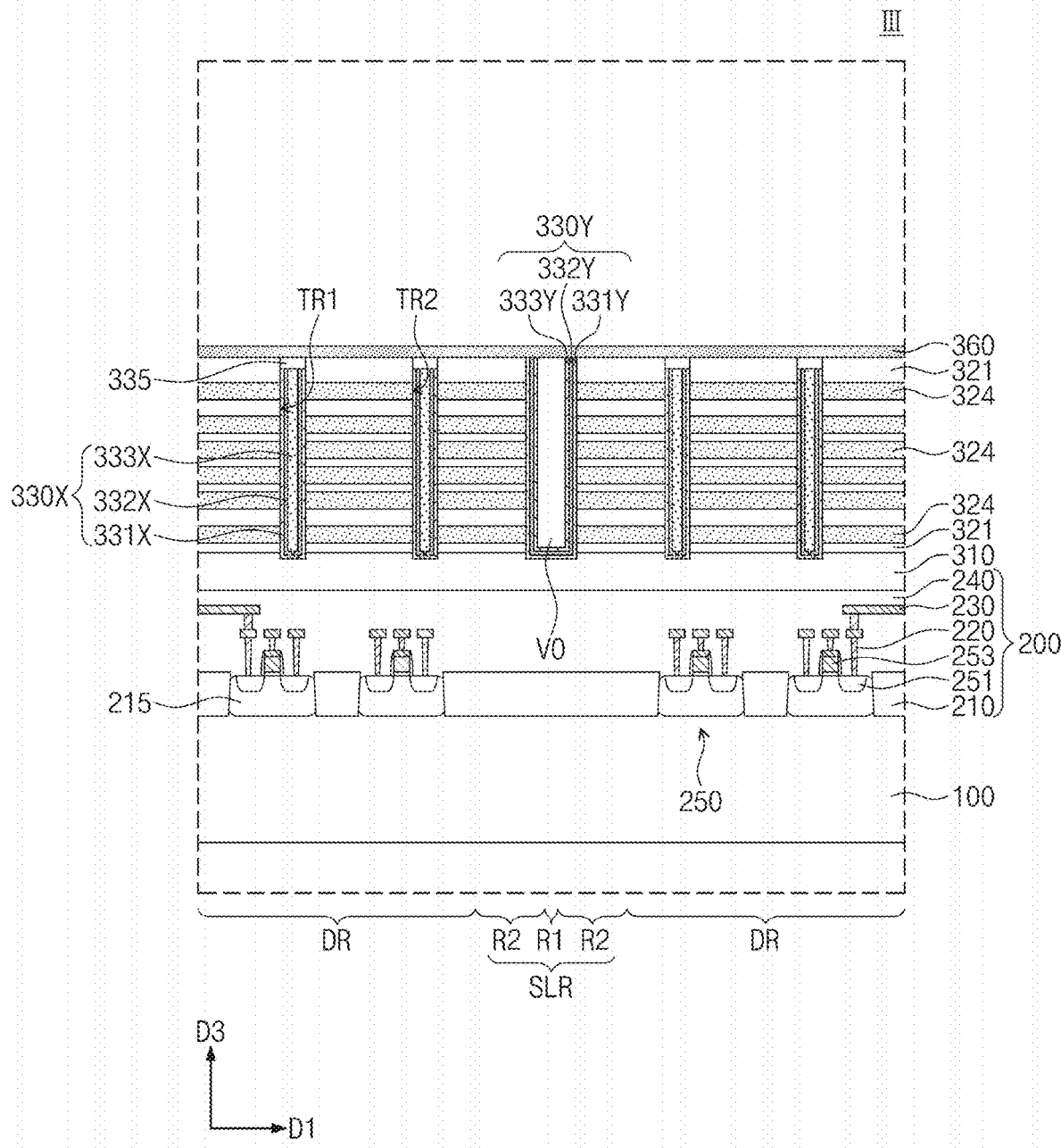

Referring to FIG. 4E, a first capping layer 360 may be formed on the uppermost first dielectric layer 321 to cover top surfaces of the conductive pads 335. A deposition process may be performed to form the first capping layer 360. The deposition process may be executed on the device regions DR and the scribe lane region SLR of the substrate 100. The first capping layer 360 may have poor step coverage to close an entrance of the first trench TR1. A bottom surface of the first capping layer 360 may be vertically spaced apart from a top surface of the dummy pattern 330Y on the bottom surface of the first trench TR1. Therefore, a void VO may be formed in the first trench TR1. The void VO may be surrounded by the dummy pattern 330Y and the first capping layer 360. Differently from that shown, a portion of the first capping layer 360 may further extend into an upper portion of the first trench TR1. This case may form a void VO discussed in the example of FIG. 2E.

Figure 4F:
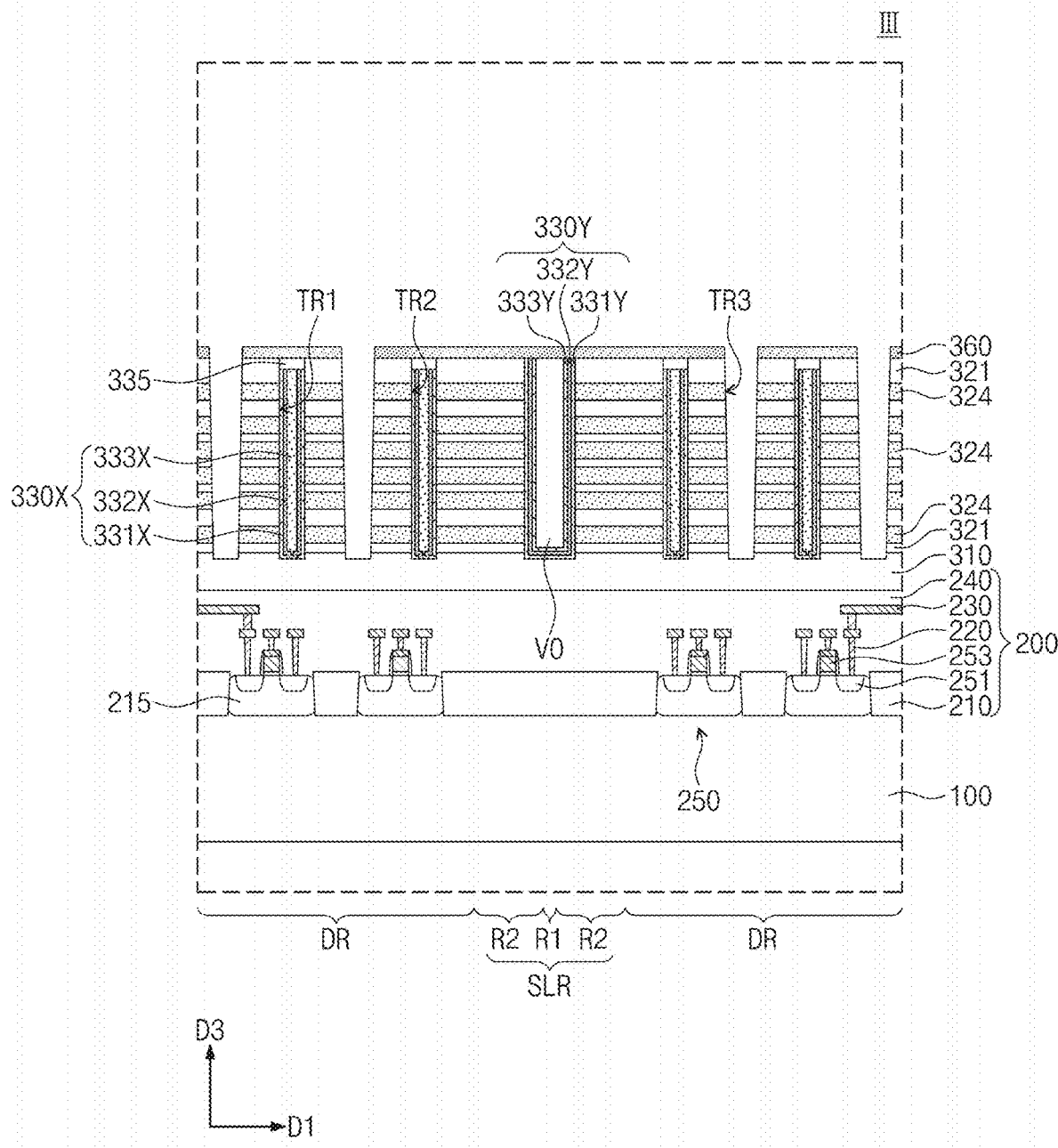

Referring to FIG. 4F, third trenches TR3 may be formed in the first capping layer 360, the first dielectric layers 321, and the second dielectric layers 324. Each of the third trenches TR3 may expose the semiconductor layer 310 while penetrating the first capping layer 360, the first dielectric layers 321, and the second dielectric layers 324. The third trenches TR3 may have their bottom surfaces at a level the same as or similar to that of the bottom surface of the first trench TR1. The third trenches TR3 may have their sidewalls that expose the first dielectric layers 321 and the second dielectric layers 324. The third trenches TR3 may be formed between neighboring second trenches TR2. The third trenches TR3 may not be formed on the scribe lane region SLR of the substrate 100. An anisotropic etching process may be performed to form the third trenches TR3.

Referring to FIG. 4G, the second dielectric layers 324 may be removed to form gate sections 329. The gate sections 329 may be empty areas. The gate sections 329 may be formed between the first dielectric layer 321 to connect to the third trenches TR3. The gate sections 329 may partially expose sidewalls of the vertical channel structures 330X. The gate sections 329 may have their thicknesses substantially the same as those of the second dielectric layers 324. An etching process may be performed to remove the second dielectric layers 324. A wet etching process may be adopted as the etching process.

Figure 4H:
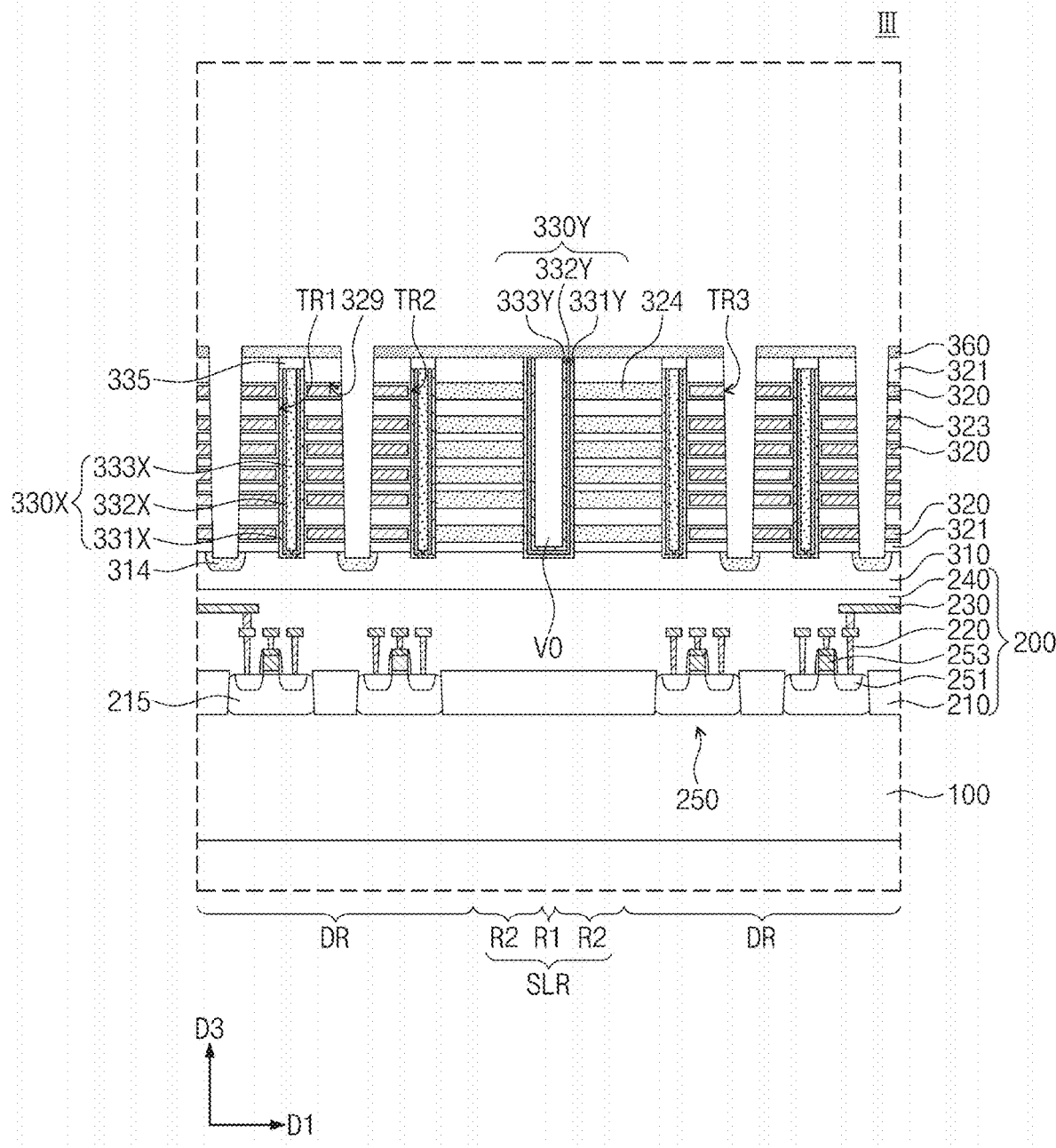

Referring to FIG. 4H, gate dielectric pattern 323 and gate structures 320 may be formed in corresponding gate sections 329.

According to some embodiments, a preliminary dielectric layer (not shown) may be formed in the third trenches TR3 and the gate sections 329. The preliminary dielectric layer may be formed by depositing a material having excellent step coverage.

The formation of the gate structures 320 may include forming a gate conductive layer and patterning the gate conductive layer. The gate conductive layer may be formed on the preliminary dielectric layer. The gate conductive layer may fill at least a portion of each of the third trenches TR3 and the gate sections 329. The gate conductive layer may be patterned such that the gate structures 320 are localized in corresponding gate sections 329. The patterning of the gate conductive layer may be achieved by an etching process.

Afterwards, the preliminary dielectric layer may be patterned to form gate dielectric patterns 323. An etching process may be executed to pattern the preliminary dielectric layer. The gate dielectric patterns 323 may be localized in the gate sections 329. An arrangement of the gate dielectric patterns 323 and the gate structures 320 may be the same as or similar to that discussed in the examples of FIGS. 2B to 2D.

Common source sections 314 may be formed in the semiconductor layer 310 exposed to the third trenches TR3. An ion implantation process may be performed to form the common source sections 314. When viewed in plan, diffusion of impurities may allow the common source sections 314 to overlap a portion of at least one of the first dielectric layers 321. The common source sections 314 may have a conductivity type different from that of the semiconductor layer 310. The formation of the common source sections 314 may be followed or preceded by the formation of the gate structures 320.

Figure 4I:
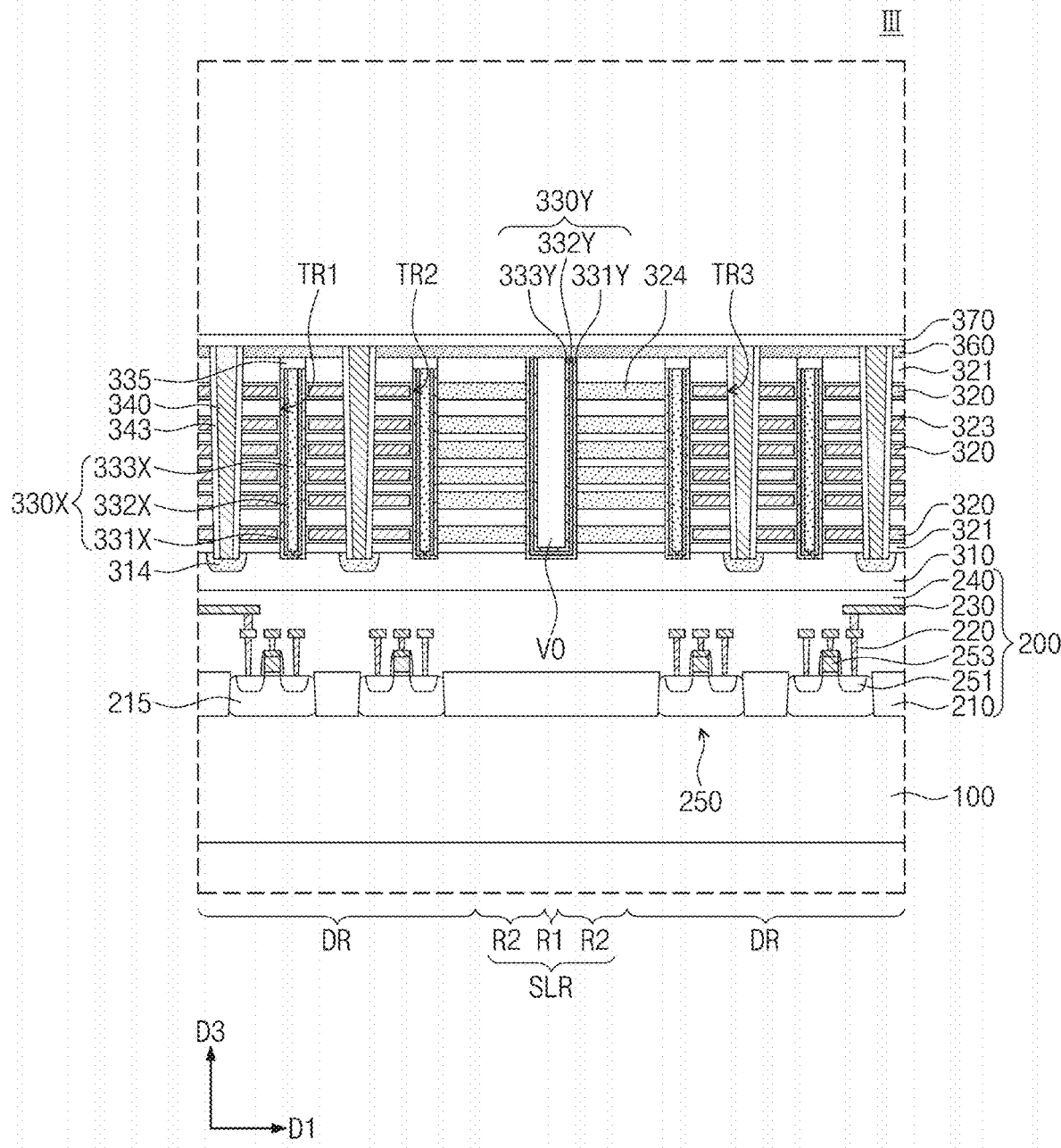

Referring to FIG. 4I, spacers 343 and contact plugs 340 may be formed in corresponding third trenches TR3. The spacers 343 may cover sidewalls of the gate structures 320. The contact plugs 340 may be formed on inner sidewalls of the spacers 343 to fill the third trenches TR3. The contact plugs 340 may be correspondingly coupled to the common source sections 314. The formation of the contact plugs 340 may include depositing a barrier layer that covers sidewalls of the spacers 343 and depositing a metal layer on the barrier layer.

A second capping layer 370 may be formed on the first capping layer 360 to cover top surfaces of the contact plugs 340.

Figure 4J:
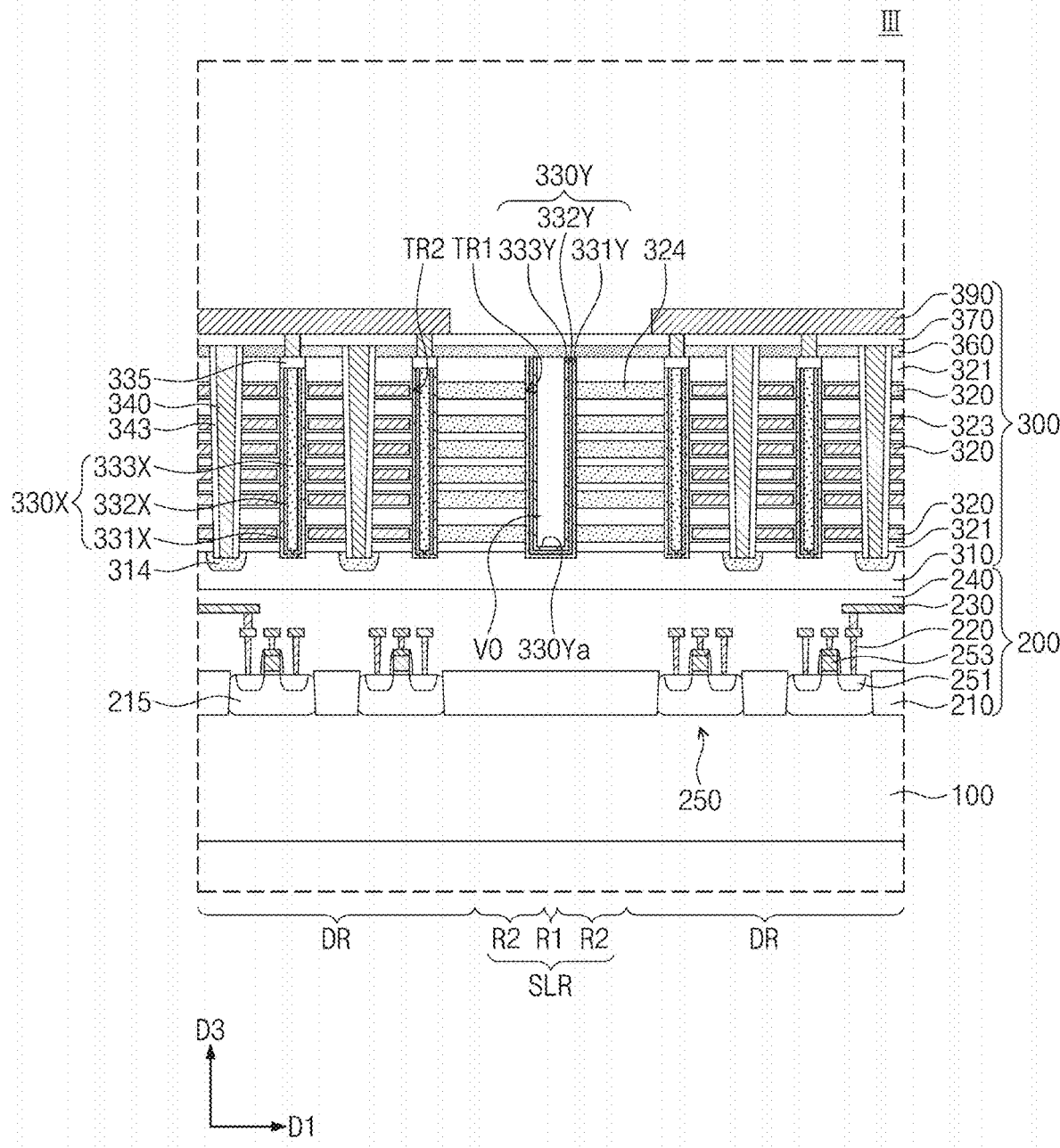

Referring to FIG. 4J, upper conductive plugs 350 may be formed in the second capping layer 370 and the first capping layer 360. The upper conductive plugs 350 may penetrate the second capping layer 370 and the first capping layer 360 to be coupled to corresponding conductive pads 335.

Conductive patterns 450 may be formed on the second capping layer 370 to be coupled to the upper conductive plugs 350.

Referring back to FIG. 2B, a wiring layer 400 may be formed on the conductive patterns 450. Chip pads 550 and a protection layer PL may be formed on the wiring layer 400. Solder balls 500 may be formed on the chip pads 550. A wafer structure 1000 therefore may be fabricated eventually.

The following will describe a wafer dicing process and a semiconductor device according to some embodiments.

Figure 5B:
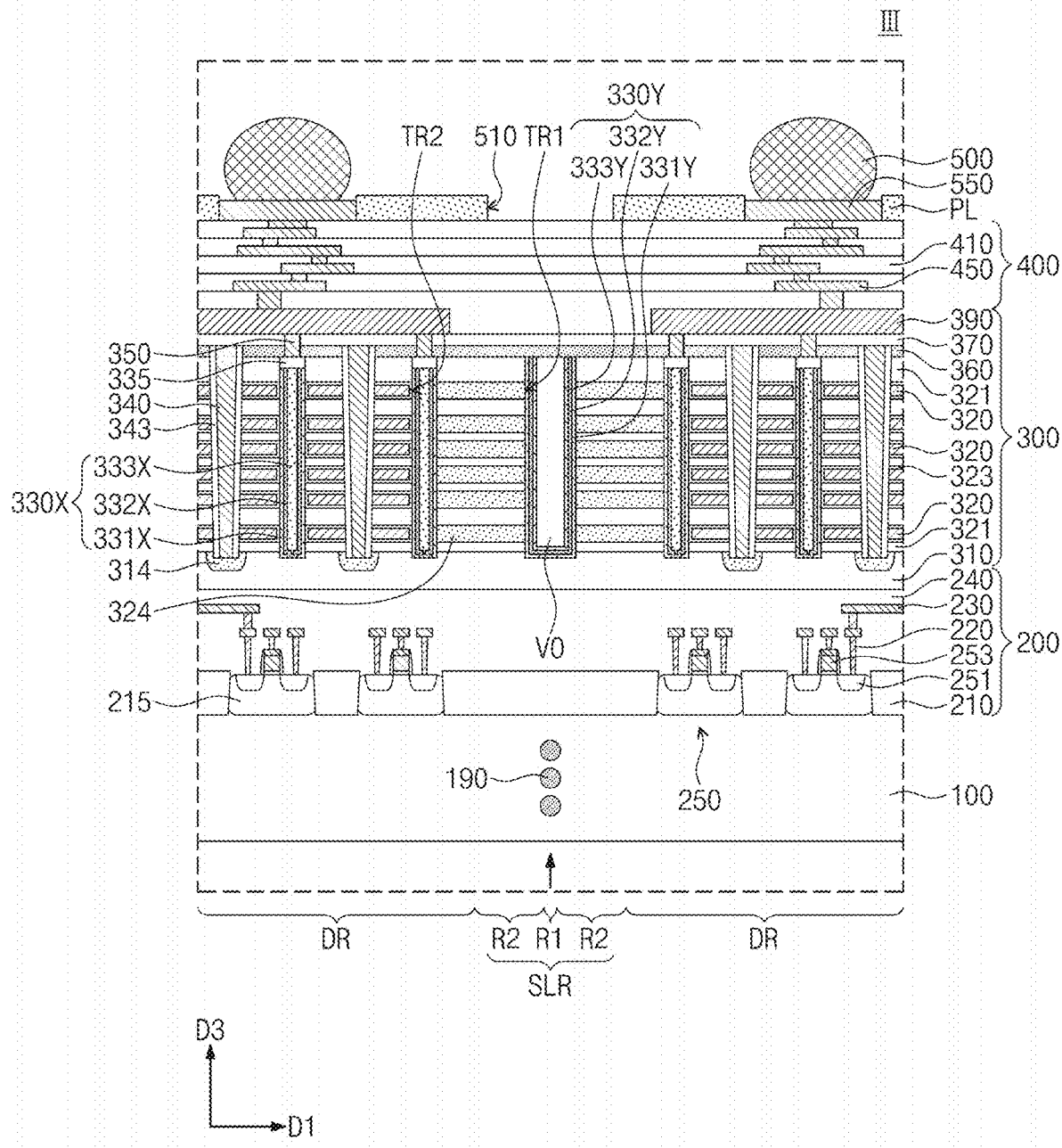
FIGS. 5B and 6B illustrate enlarged cross-sectional views showing sections III of FIGS. 5A and 6A, respectively.
Figure 6A:
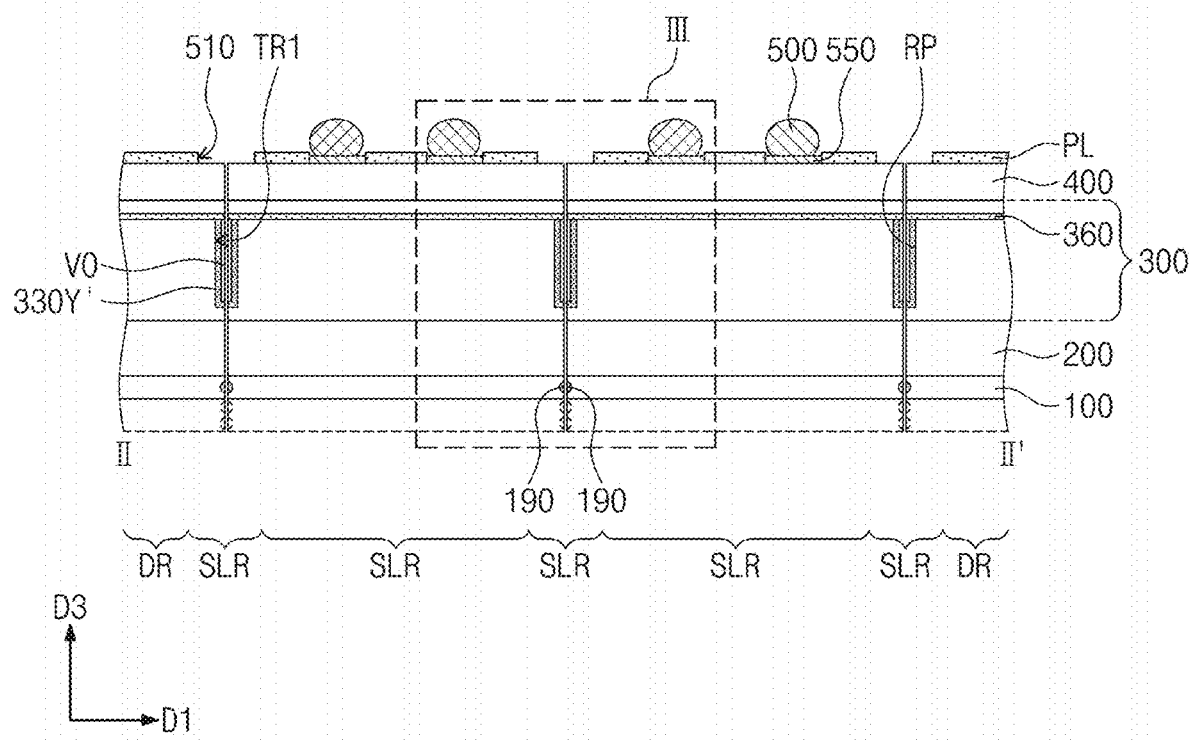
Figure 6B:
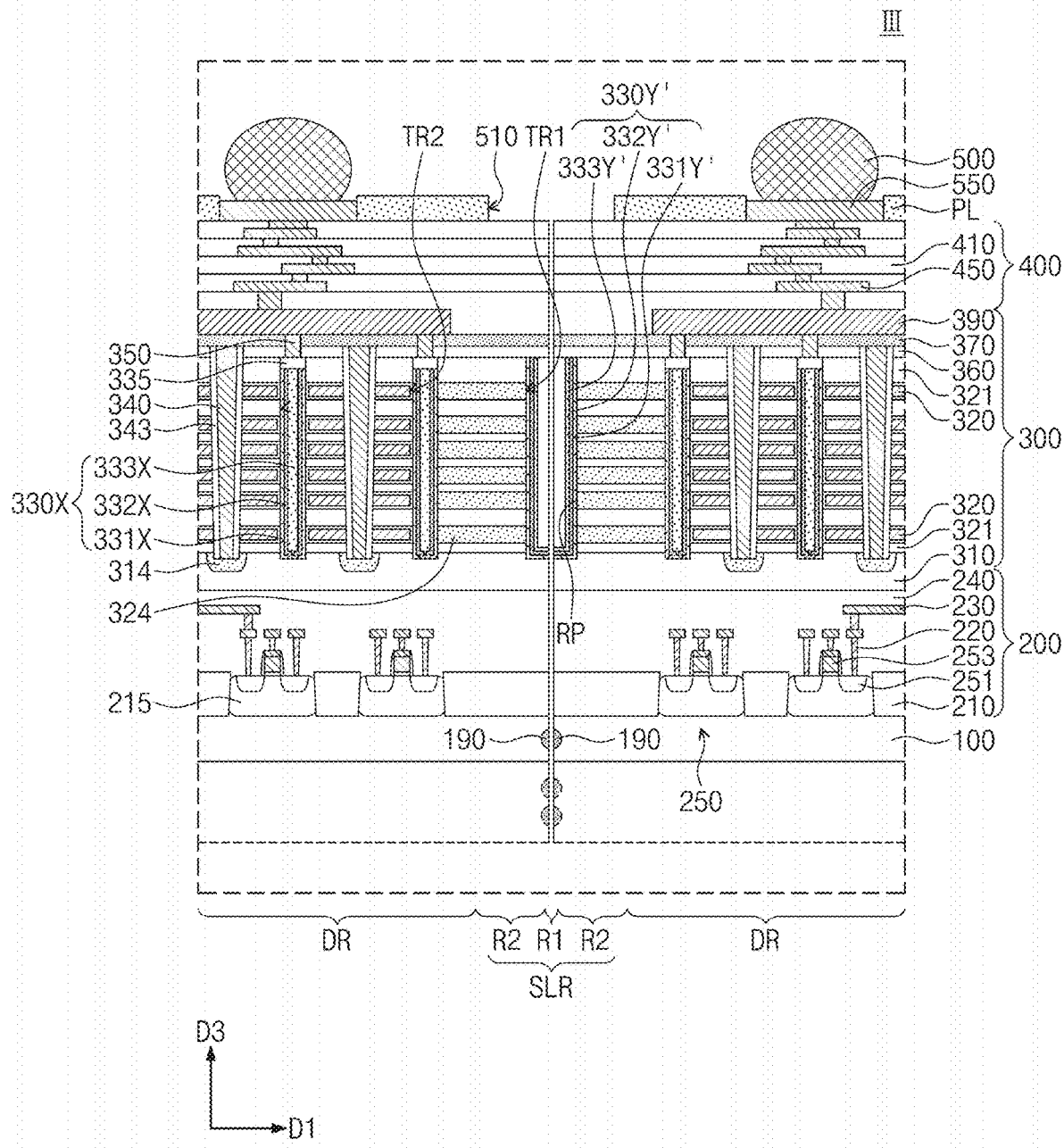

FIGS. 5A and 6A illustrate cross-sectional views showing a dicing process according to some embodiments. FIG. 5B illustrates an enlarged view showing section III of FIG. 5A. FIG. 6B illustrates an enlarged view showing section III of FIG. 6A.

Referring to FIGS. 5A and 5B, the wafer structure 1000 may be prepared. As discussed above, the wafer structure 1000 may include the substrate 100, the logic structure 200, the cell array structure 300, the wiring layer 400, the chip pads 550, and the protection layer PL. The cell array structure 300 may have the first trench TR1, and the void VO may be provided in the first trench TR1. The void VO may be surrounded by the dummy pattern 330Y and the first capping layer 360.

A laser apparatus 900 may be disposed on a bottom surface of the substrate 100. The substrate 100 may be irradiated with a laser from the laser apparatus 900, thereby being locally heated. A crystal structure in the heated region of the substrate 100 may be changed. Therefore, amorphous portions 190 may be formed in the substrate 100. The laser may be irradiated along the scribe lane region SLR of the substrate 100, and when viewed in plan, the amorphous portions 190 may overlap the scribe lane region SLR. For example, as illustrated in FIG. 5B, the amorphous portions 190 may be formed in the dicing region R1 of the substrate 100. The amorphous portions 190 may be formed at positions whose depths are different from each other in the substrate 100. For example, the amorphous portions 190 may be located at different distances from a bottom surface of the substrate 100. The amorphous portions 190 may be vertically spaced apart from each other in the substrate 100.

Referring to FIGS. 6A and 6B, a grinding process may be performed on the bottom surface of the substrate 100, and thus a portion of the substrate 100 may be removed as indicated by a dotted line. The grinding process may cause the substrate 100 to become small in thickness. The grinding process of the substrate 100 may include a back-lap process or a chemical mechanical polishing process. The amorphous portions 190 of the substrate 100 may serve as crack seeds in the grinding process performed on the substrate 100. For example, a crack may be generated from the amorphous portions 190 of the substrate 100. The crack may vertically propagate toward the bottom surface of the substrate 100 and a top surface of the wiring layer 400. The wafer structure 1000 may be diced due to the crack propagation.

When the void VO is absent, the crack may propagate along interfaces between the first dielectric layers 321 and the second dielectric layers 324 when the crack runs across the first and second dielectric layers 321 and 324 of the substrate 100. As the crack horizontally propagates, it may be difficult to dice the wafer structure 1000. In addition, the horizontal crack propagation may cause damage to the gate structures 320 and/or the vertical channel structures 330X in the device regions DR of the substrate 100. According to some embodiments, because the void VO is provided on the dicing region R1 of the substrate 100, interfaces between the first dielectric layers 321 and the second dielectric layers 324 may not be provided on the dicing region R1 of the substrate 100. Therefore, it may be possible to limit and/or prevent the horizontal crack propagation. The crack may easily pass through the cell array structure 300 via the void VO. In addition, it may be possible to satisfactorily dice the wafer structure 1000.

The dicing process of the wafer structure 1000 may remove the dicing region R1 of the substrate 100. Moreover, it may be possible to remove a portion of the logic structure 200, a portion of the cell array structure 300, and a portion of the wiring layer 400 on the dicing region R1 of the substrate 100.

At least a portion of the dummy region R2 of the substrate 100 may not be removed in the dicing process. The presence of the dummy region R2 of the substrate 100 may limit and/or prevent damage to the wiring layer 400, the cell array structure 300, and the logic structure 200 on the device regions DR of the substrate 100 in the dicing process. For example, it may be possible to limit and/or prevent damage to the peripheral circuits 250, the lower lines 230, the vertical channel structures 330X, the gate structures 320, the conductive lines 390, and the conductive patterns 450.

As a result of the dicing process, semiconductor devices 10 may be formed which are separated from each other. Each of the semiconductor devices 10 may include one of the device regions DR of the substrate 100. Each of the semiconductor devices 10 may include the logic structure 200, the cell array structure 300, and the wiring layer 400 that correspond to the device region DR. In addition, each of the semiconductor device 10 may include a corresponding dummy region R2 of the substrate 100, the logic structure 200 on the dummy region R2, the wiring structure, the wiring layer 400, the protection layer PL, the chip pads 550, and the solder balls 500. The dicing process may form a plurality of dummy patterns 330Y' that are separated from each other. The first trench TR1 may be diced to form a recessed portion RP.

Certain amorphous portions 190 may remain in the dummy region R2 of the substrate 100. Alternatively, the amorphous portions 190 may be removed together with the dicing region R1 of the substrate 100, and thus may not be included in the semiconductor device 10.

Through the processes discussed above, the semiconductor devices 10 may be eventually fabricated. Each of the semiconductor devices 10 may be a semiconductor chip.

The following will describe in detail the semiconductor devices 10. A single semiconductor device 10 will be discussed in the interest of brevity.

Figure 7A:
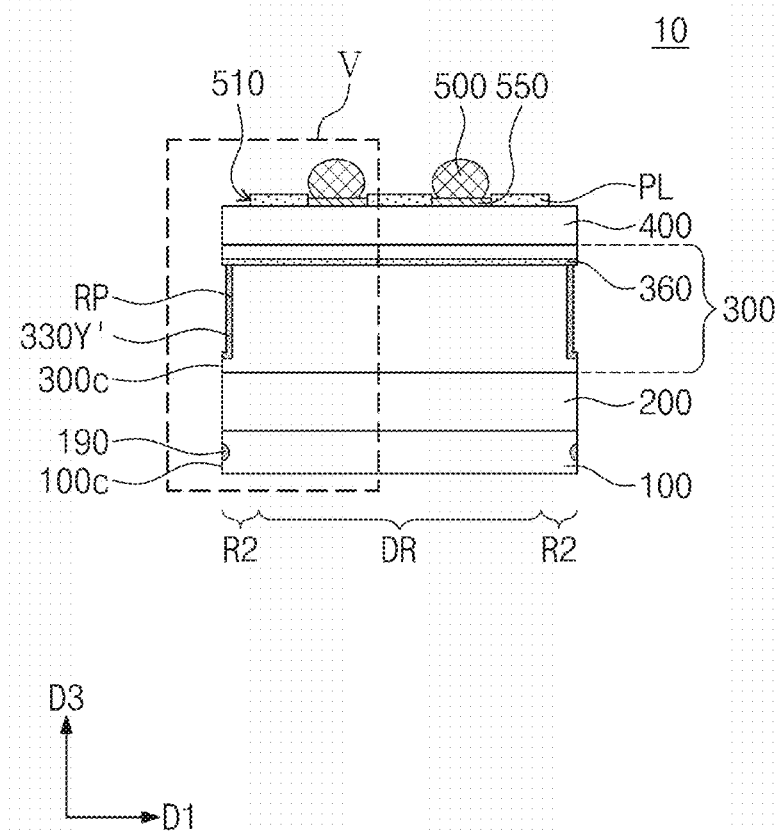
FIG. 7A illustrates a cross-sectional view showing a semiconductor device according to some embodiments.
Figure 7B:
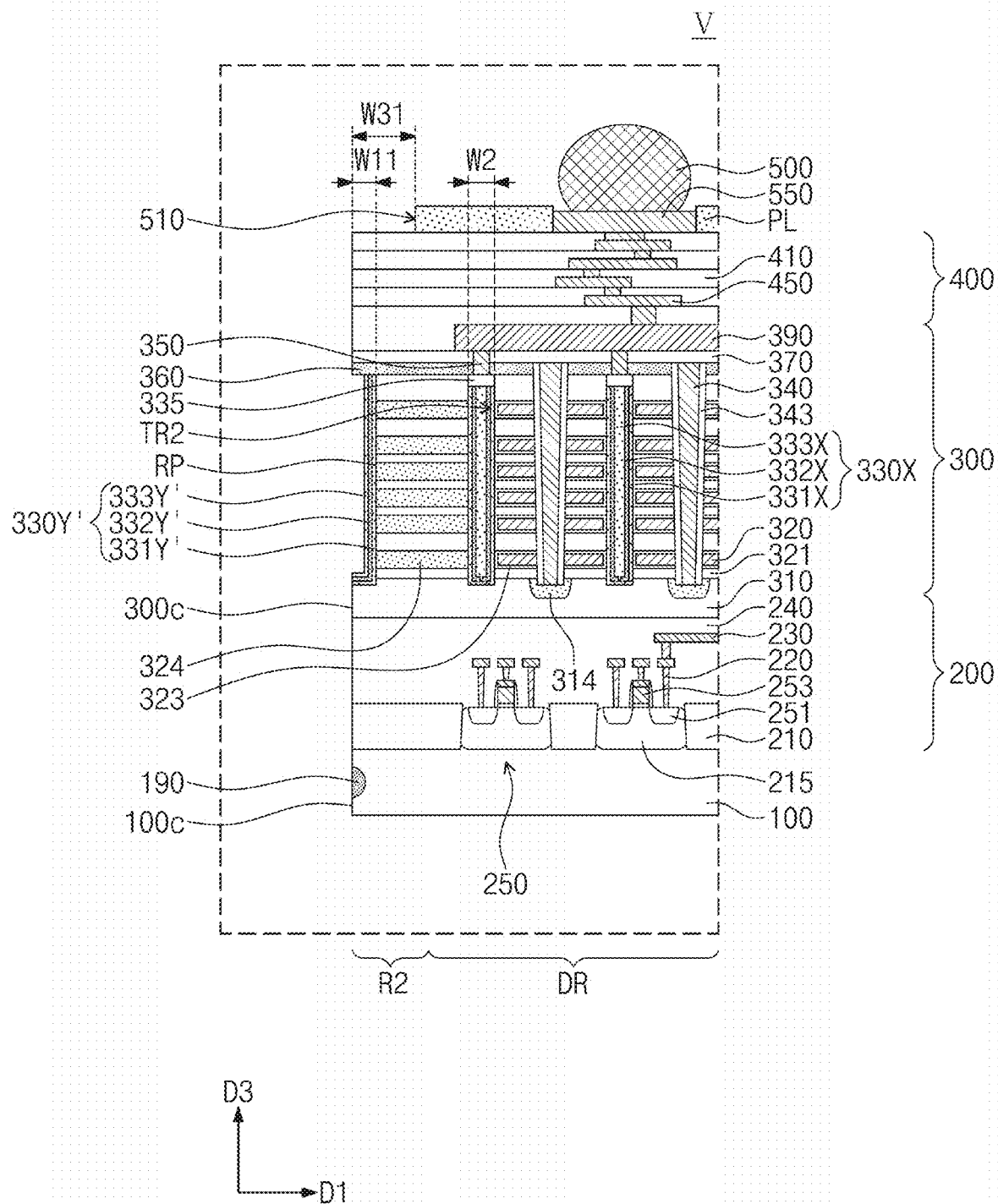
FIG. 7B illustrates an enlarged view showing section V of FIG. 7A.

FIG. 7A illustrates a cross-sectional view showing a semiconductor device according to some embodiments. FIG. 7B illustrates an enlarged view showing section V of FIG. 7A.

Referring to FIGS. 7A and 7B, a semiconductor device 10 may include the substrate 100, the logic structure 200, the cell array structure 300, the wiring layer 400, the protection layer PL, the chip pads 550, and the solder balls 500. The semiconductor device 10 may be one of the semiconductor devices 10 formed by the dicing process performed on the wafer structure 1000 discussed in the examples of FIGS. 5A to 6B. An outer sidewall of the semiconductor device 10 may be a cutting surface. The outer sidewall of the semiconductor device 10 may include an outer sidewall 100c of the substrate 100, an outer sidewall of the logic structure 200, an outer sidewall 300c of the cell array structure 300, and an outer sidewall of the wiring layer 400. The outer sidewall of the semiconductor device 10 may be exposed externally.

The substrate 100 may include the device region DR and the dummy region R2. The dummy region R2 may be an edge region of the substrate 100. For example, when viewed in plan, the dummy region R2 of the substrate 100 may surround the device region DR of the substrate 100. The amorphous portion 190 may remain on the outer sidewall 100c of the substrate 100. The amorphous portion 190 may be exposed externally.

The logic structure 200 may be provided on the substrate 100. The logic structure 200 may be vertically aligned with the outer sidewall 100c of the substrate 100.

The cell array structure 300 may be provided on the logic structure 200. The cell array structure 300 may include the dummy pattern 330Y', the first dielectric layers 321, the second dielectric layers 324, the gate structures 320, the vertical channel structures 330X, the contact plugs 340, the spacers 343, the first capping layer 360, the second capping layer 370, and the conductive line 390.

The outer sidewall 300c of the cell array structure 300 may be exposed by the substrate 100 and the logic structure 200. For example, the outer sidewall 300c of the cell array structure 300 may be above an edge (e.g., outer sidewall 100c) of the substrate 100 and above an edge of the logic structure 200. In an embodiment, the outer sidewall 300c of the cell array structure 300 may be flush with an edge of the logic structure 200 and flush with the outer sidewall 100c of the substrate 100. The cell array structure 300 may have the recessed portion RP on the outer sidewall 300c thereof. The recessed portion RP may be provided on outer sidewalls of the first dielectric layers 321 and outer sidewalls of the second dielectric layers 324. The recessed portion RP may be formed as a result of the dicing process performed on the first trench TR1 and the void VO discussed in the examples of FIGS. 2A to 2D. For example, the recessed portion RP may be a portion of the first trench TR1 that remains as a result of the dicing process. The recessed portion RP may have a width W11 ranging from about 3 nm to about 50 nm. For example, the width W11 of the recessed portion RP may range from about 5 nm to about 50 nm. The width W11 of the recessed portion RP may be substantially the same as a horizontal interval between an outer sidewall of the semiconductor layer 310 and the outer sidewalls of the first dielectric layers 321. The outer sidewall of the semiconductor layer 310 may correspond to the outer sidewall 300c of the cell array structure 300. The width W11 of the recessed portion RP may be greater than the width W2 of the second trench TR2.

The dummy pattern 330Y' may be provided on the recessed portion RP, and may cover a bottom surface and a sidewall of the recessed portion RP. For example, the dummy pattern 330Y' may conformally cover a top surface of the substrate 100, the outer sidewalls of the first dielectric layers 321, and the outer sidewalls of the second dielectric layers 324. The dummy pattern 330Y' may have an L shape or a shape bilaterally symmetric to an L shape. The dummy pattern 330Y' may include a first lower dielectric pattern 331Y', a first semiconductor pattern 332Y', and a first upper dielectric pattern 333Y'. The first lower dielectric pattern 331Y', the first semiconductor pattern 332Y', and the first upper dielectric pattern 333Y' may be substantially the same as the first lower dielectric pattern 331Y, the first semiconductor pattern 332Y, and the first upper dielectric pattern 333Y discussed in the example of FIGS. 2A to 2D or in the example of FIG. 2E. However, shapes of the first lower dielectric pattern 331Y', the first semiconductor pattern 332Y', and the first upper dielectric pattern 333Y' may be different from those of the first lower dielectric pattern 331Y, the first semiconductor pattern 332Y, and the first upper dielectric pattern 333Y discussed in the example of FIGS. 2A to 2D or in the example of FIG. 2E. Each of the first lower dielectric pattern 331Y', the first semiconductor pattern 332Y', and the first upper dielectric pattern 333Y' have an L shape or a shape bilaterally symmetric to an L shape.

An outer sidewall of the dummy pattern 330Y' on the sidewall of the recessed portion RP may not be vertically aligned with the outer sidewall 100c of the substrate 100 and the outer sidewall of the logic structure 200. The outer sidewall of the dummy pattern 330Y' on the sidewall of the recessed portion RP may be recessed more than the outer sidewall 100c of the substrate 100.

The first capping layer 360 may further extend onto the dummy region R2 of the substrate 100. An outer sidewall of the first capping layer 360 may horizontally protrude more than the outer sidewall of the dummy pattern 330Y' on the sidewall of the recessed portion RP. A bottom surface of the first capping layer 360 on the dummy region R2 of the substrate 100 may vertically overlap a top surface of the recessed portion RP. The bottom surface of the first capping layer 360 on the dummy region R2 of the substrate 100 may be vertically spaced apart from a top surface of the dummy pattern 330Y' on the top surface of the recessed portion RP. A gap may be provided between the bottom surface of the first capping layer 360 on the dummy region R2 of the substrate 100 and the top surface of the dummy pattern 330Y' on the top surface of the recessed portion RP. The outer sidewall of the first capping layer 360 may be vertically aligned with the outer sidewall 100c of the substrate 100, but inventive concepts are not limited thereto.

The second capping layer 370 and the wiring layer 400 may be disposed on the first capping layer 360.

The protection layer PL may be disposed on the wiring layer 400. The protection layer PL may have a diced opening 510 that overlaps the dummy region R2 of the substrate 100. An outer sidewall of the protection layer PL may not be vertically aligned with an outer sidewall of the wiring layer 400. An interval W31 between the outer sidewall of the protection layer PL and the outer sidewall of the wiring layer 400 may be greater than the width W11 of the recessed portion RP. The interval W31 between the outer sidewall of the protection layer PL and the outer sidewall of the wiring layer 400 may be less than the width W3 of the opening 510 depicted in FIG. 2C. Each of the semiconductor devices 10 may include a memory device, such as NAND Flash. Each of the semiconductor devices 10 may further include a logic device, such as a digital signal processor or a controller.

Figure 7C:
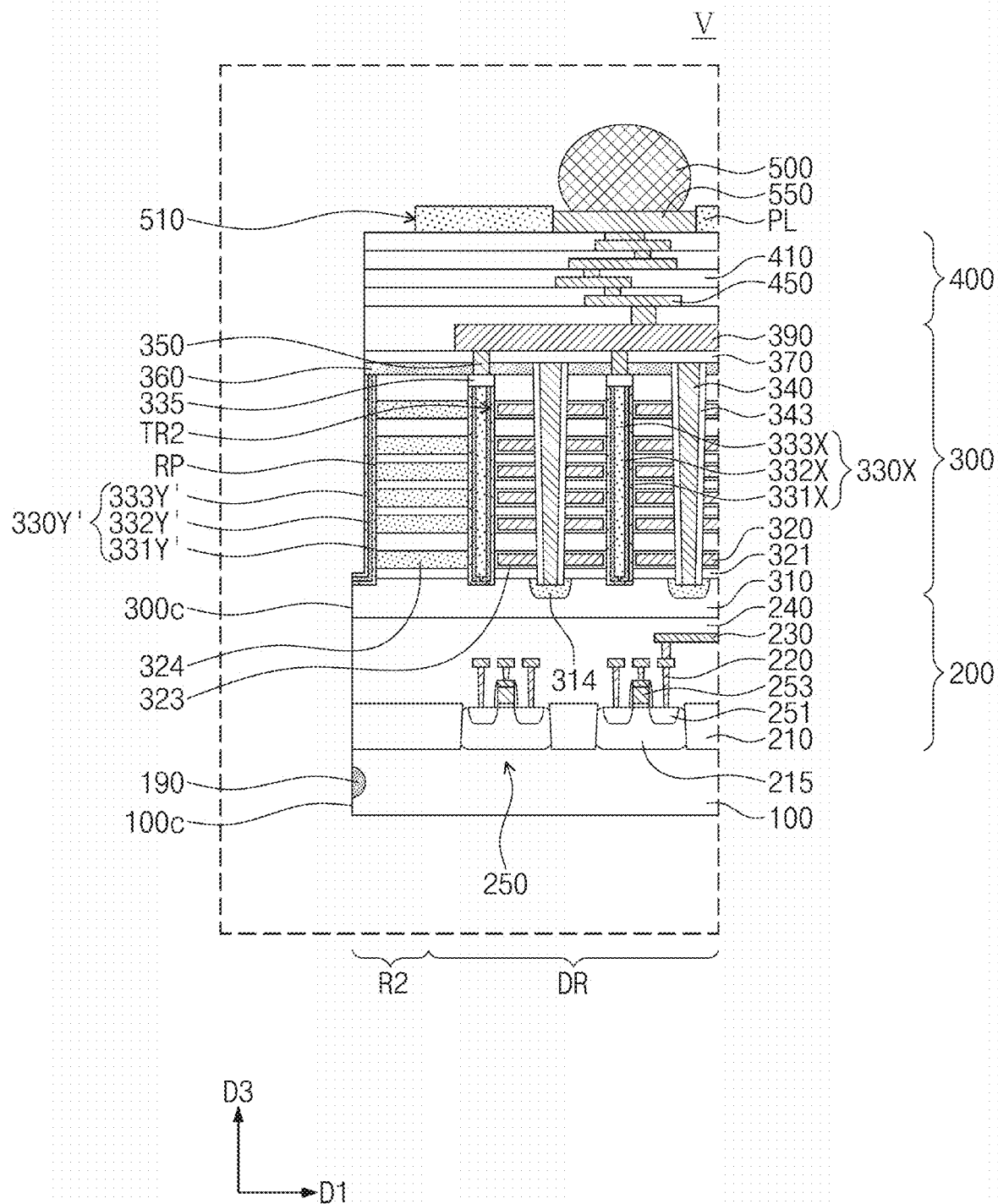
FIG. 7C illustrates a cross-sectional view showing a recessed portion and a first capping layer according to some embodiments.

FIG. 7C illustrates an enlarged view of section V depicted in FIG. 7A, showing a recessed portion and a first capping layer according to some embodiments.

Referring to FIG. 7C, the outer sidewall of the first capping layer 360 may not be vertically aligned with the outer sidewall 100c of the substrate 100. The outer sidewall of the first capping layer 360 may not protrude more than the outer sidewall of the dummy pattern 330Y' on the sidewall of the recessed portion RP. For example, the outer sidewall of the first capping layer 360 may be vertically aligned with the outer sidewall of the dummy pattern 330Y' on the sidewall of the recessed portion RP. Alternatively, the outer sidewall of the first capping layer 360 may be horizontally recessed more than the outer sidewall of the dummy pattern 330Y' on the sidewall of the recessed portion RP.

Figure 7D:
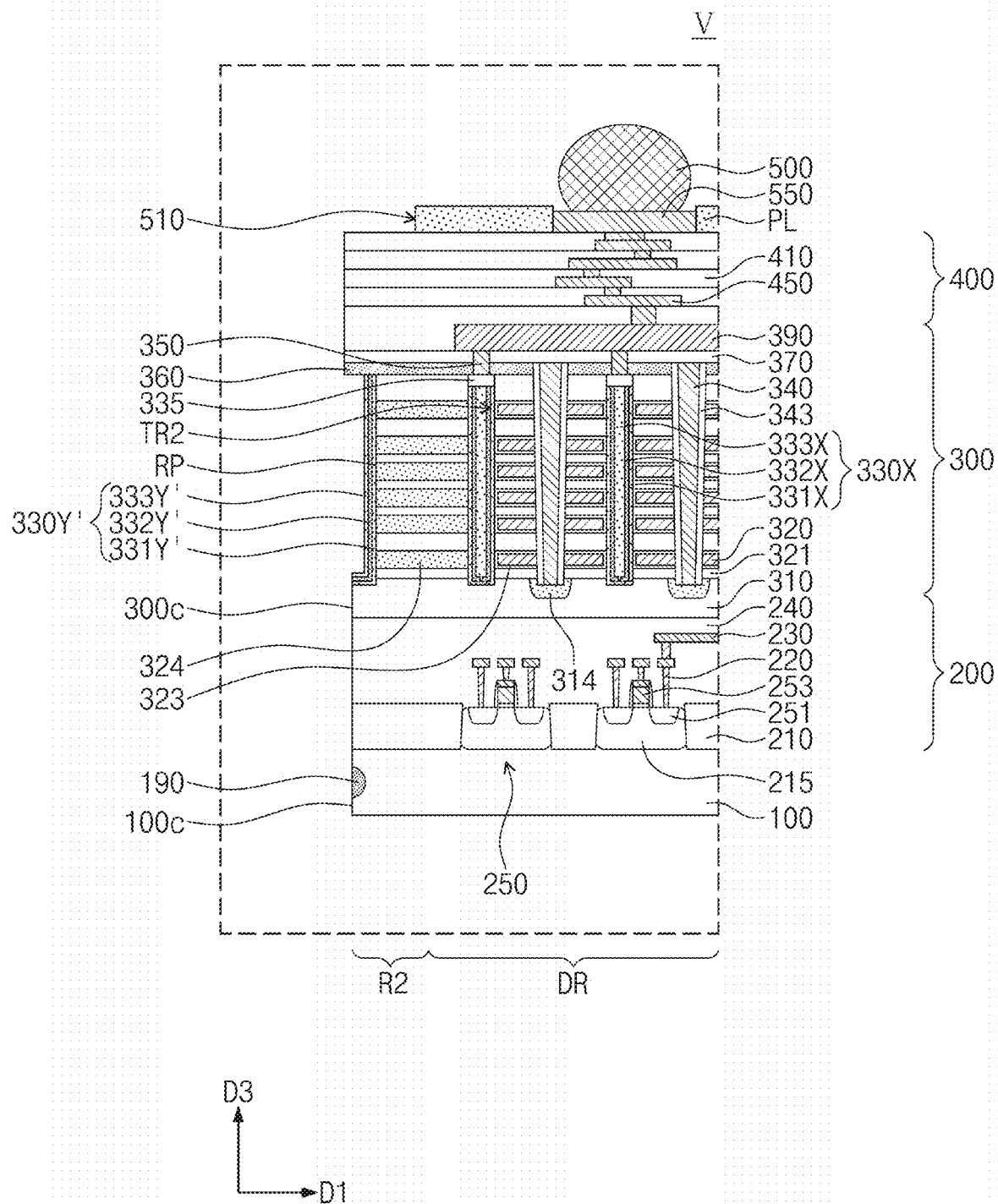
FIG. 7D illustrates a cross-sectional view showing a recessed portion and a first capping layer according to some embodiments.

FIG. 7D illustrates an enlarged view of section V depicted in FIG. 7A, showing a recessed portion and a first capping layer according to some embodiments.

Referring to FIG. 7D, the outer sidewall of the first capping layer 360 may horizontally protrude more than the outer sidewall of the dummy pattern 330Y' on the sidewall of the recessed portion RP. When viewed in plan, the outer sidewall of the first capping layer 360 may protrude more than the outer sidewall 100c of the substrate 100.

Figure 8A:
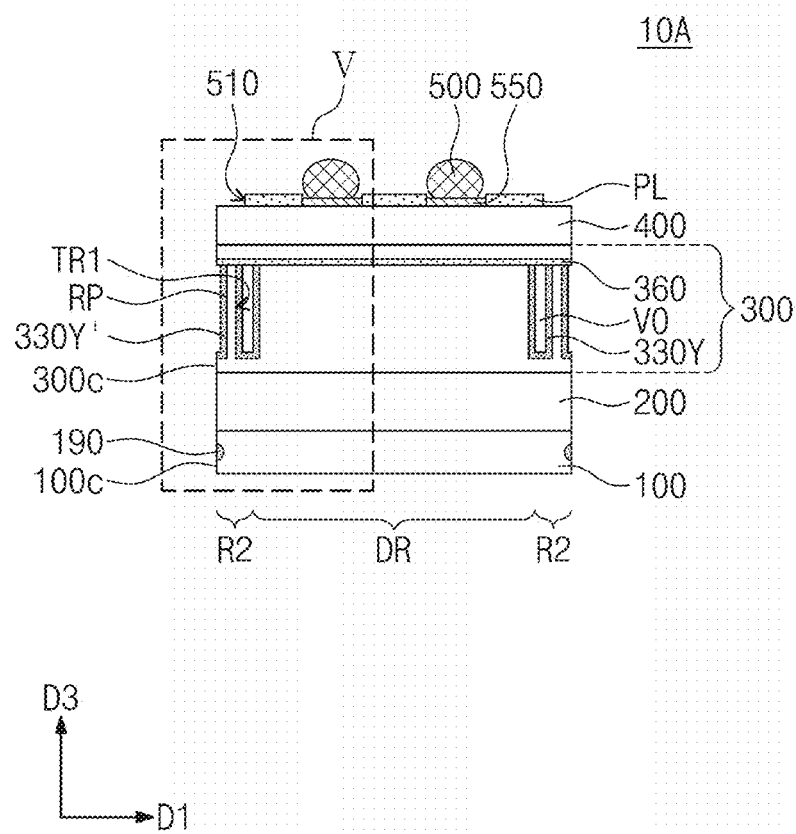
FIG. 8A illustrates a cross-sectional view showing a semiconductor device according to some embodiments.
Figure 8B:
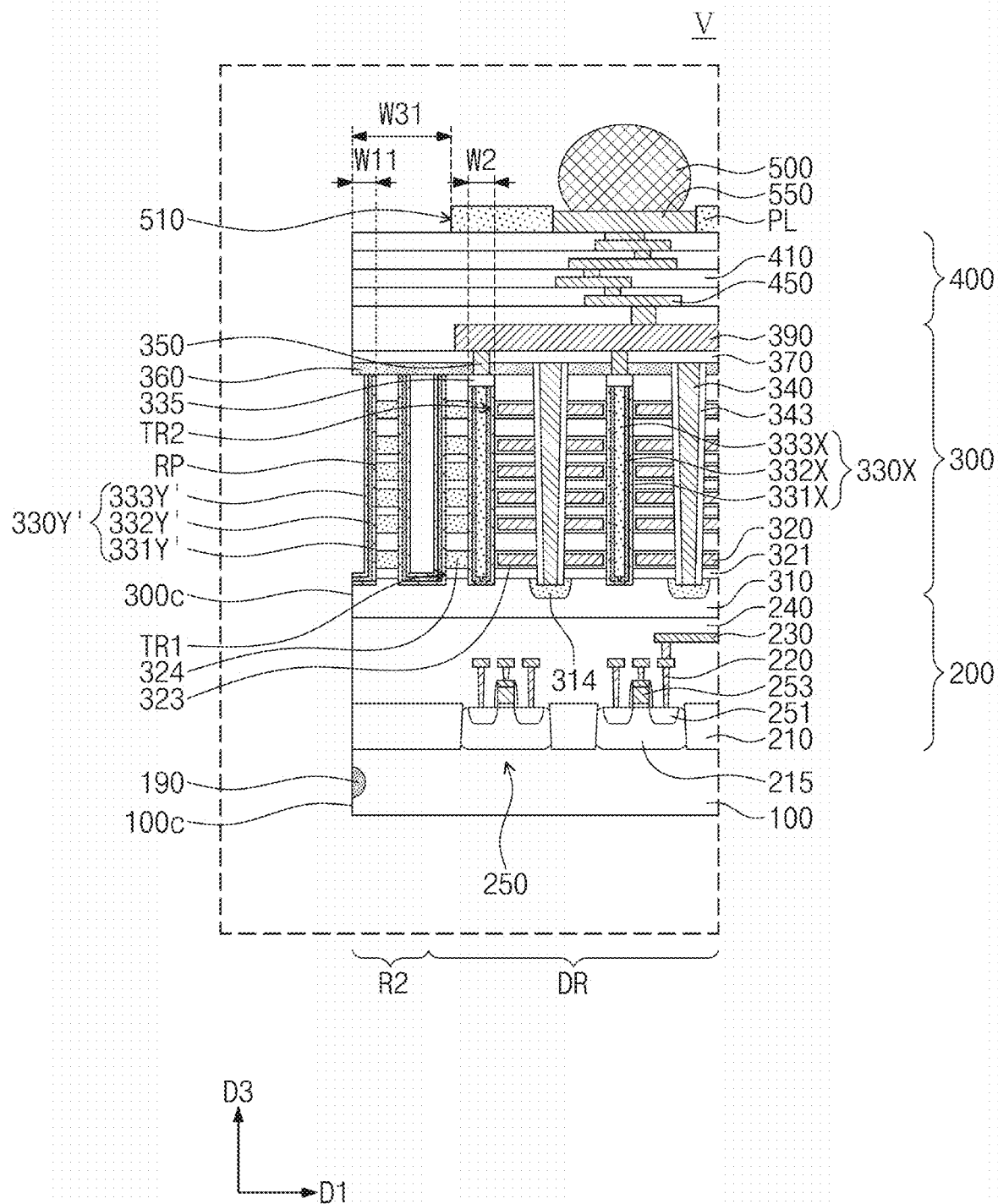
FIG. 8B illustrates an enlarged view showing section V of FIG. 8A.

FIG. 8A illustrates a cross-sectional view showing a semiconductor device according to some embodiments. FIG. 8B illustrates an enlarged view showing section V of FIG. 8A.

Referring to FIGS. 8A and 8B, a semiconductor device 10A may include a substrate 100, a logic structure 200, a cell array structure 300, a wiring layer 400, a protection layer PL, chip pads 550, and solder balls 500. The semiconductor device 10A may be formed by dicing the wafer structure discussed in the example of FIGS. 3A and 3B.

The cell array structure 300 may have a recessed portion RP and a first trench TR1. The recessed portion RP may be substantially the same as that discussed in the examples of FIGS. 7A to 7D. The cell array structure 300 may include a dummy pattern 330Y', and the dummy pattern 330Y' may be provided on a sidewall and a bottom surface of the recessed portion RP.

A void VO may be provided in the first trench TR1. The first trench TR1 and the void VO may be provided on a dummy region R2 of the substrate 100. The first trench TR1 and the void VO may be provided between the recessed portion RP of the substrate 100 and a device region DR of the substrate 100. For example, the first trench TR1 may be interposed between the dummy pattern 330Y' and an outermost vertical channel structure 330X. The cell array structure 300 may include a dummy pattern 330Y'. The dummy pattern 330Y' may be provided on a bottom surface and a sidewall of the first trench TR1. The void VO, the dummy pattern 330Y', and the first trench TR1 may be substantially the same as the void VO, the dummy pattern 330Y, and the first trench TR1 discussed in the example of FIGS. 2A to 2D or in the example of FIGS. 3A and 3B.

Figure 9:
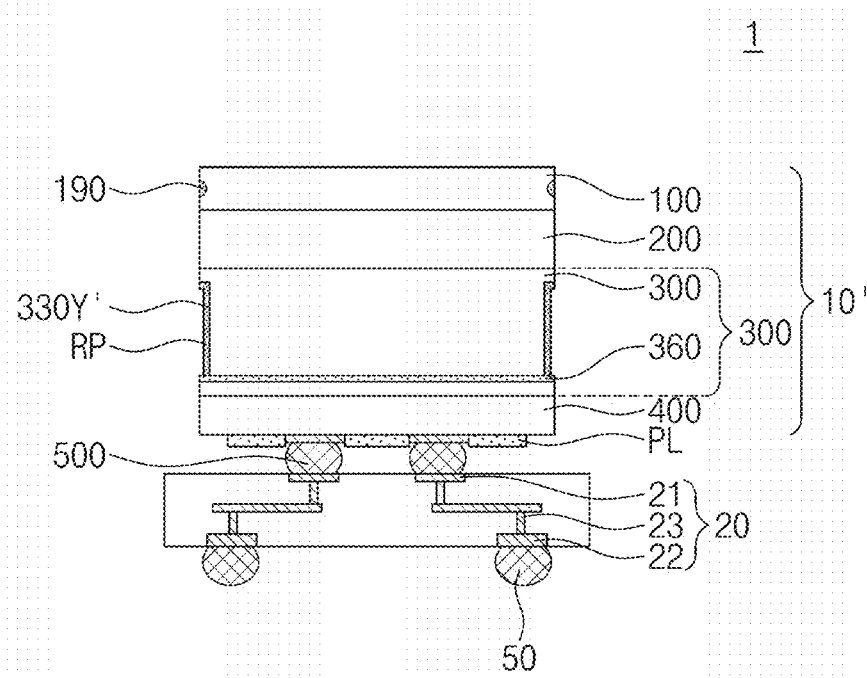
FIG. 9 illustrates a cross-sectional view showing a semiconductor package according to some embodiments.

FIG. 9 illustrates a cross-sectional view showing a semiconductor package according to some embodiments.

Referring to FIG. 9, a semiconductor package 1 may include a package substrate 20 and a semiconductor device 10. The package substrate 20 may be, for example, a printed circuit board (PCB) or a redistribution layer. The package substrate 20 may include lower substrate pads 22, upper substrate pads 21, and substrate wiring lines 23. The lower substrate pads 22 and the upper substrate pads 21 may be respectively disposed on bottom and top surfaces of the package substrate 20. The substrate wiring lines 23 may be provided in the package substrate 20. The upper substrate pads 21 may be electrically connected to the lower substrate pads 22. The lower substrate pads 22, the upper substrate pads 21, and the substrate wiring lines 23 may include a conductive material, such as metal.

The semiconductor package 1 may further include solder terminals 50. The solder terminals 50 may be correspondingly disposed on the lower substrate pads 22. The solder terminals 50 may include a solder material.

The semiconductor device 10 may be mounted on the substrate 100. The mounting of the semiconductor device 10 may include connecting the solder balls 500 to the upper substrate pads 21. Therefore, the semiconductor device 10 may be electrically and physically connected to the package substrate 20. The semiconductor device 10 may be the same as the semiconductor device 10 discussed in the example of FIGS. 7A and 7B. Alternatively, the semiconductor device 10 may be configured such that the semiconductor device 10A of FIGS. 8A and 8B is mounted on the package substrate 20.

The semiconductor package 1 may further include a molding layer. The molding layer may be disposed on a top surface of the package substrate 20 and may cover the semiconductor device 10. The molding layer may include a dielectric polymer, such as an epoxy-based molding compound.

According to inventive concepts, a wafer structure may include a void. The void may be provided on a scribe lane region of a semiconductor substrate and in a cell array structure. The void may facilitate dicing of the wafer structure. Therefore, it may be possible to limit and/or prevent damage to components on device regions of a semiconductor chip. A semiconductor device may be fabricated at high yield and may have increased reliability.

Although some embodiments of inventive concepts have been described in connection with the accompanying drawings, it will be understood by those skilled in the art that various changes and modifications may be made without departing from the technical spirit and features of inventive concepts. It therefore will be understood that the embodiments described above are described for illustrative purposes and not for the purpose of limitation.

What is claimed is:

1. A semiconductor device, comprising:
   a substrate including a device region and a dummy region, the dummy region surrounding the device region in a plan view; and
   a cell array structure on the substrate,
   the cell array structure including a plurality of first dielectric layers, a plurality of gate structures, a vertical channel structure, and a dummy pattern,
   the vertical channel structure on the device region of the substrate and penetrating the plurality of gate structures and the plurality of first dielectric layers,
   the cell array structure including an outer sidewall above an edge of the substrate and a recessed portion on the outer sidewall of the cell array structure,
   the dummy pattern covering a sidewall of the recessed portion and a bottom surface of the recessed portion, and
   the dummy pattern including a material same as a material of the vertical channel structure.

2. The semiconductor device of claim 1, wherein
   the dummy pattern is laterally spaced apart from the vertical channel structure, and
   the dummy pattern includes a first semiconductor pattern and a first upper dielectric pattern on a first lower dielectric pattern.

3. The semiconductor device of claim 2, wherein the vertical channel structure includes:
   a second lower dielectric pattern including a material same as a material of the first lower dielectric pattern;
   a second semiconductor pattern on the second lower dielectric pattern and including a material same as a material of the first semiconductor pattern; and
   a second upper dielectric pattern on the second semiconductor pattern and including a material same as a material of the first upper dielectric pattern.

4. The semiconductor device of claim 1, further comprising:
   a conductive pad on the vertical channel structure, wherein
   a height of the dummy pattern is same as a sum of a height of the vertical channel structure and a height of the conductive pad.

5. The semiconductor device of claim 1, wherein
   the cell array structure further includes a capping layer on the vertical channel structure, and
   the capping layer is vertically spaced apart from the dummy pattern on a top surface of the recessed portion.

6. The semiconductor device of claim 1, wherein
   the cell array structure further includes a plurality of second dielectric layers on the dummy region of the substrate,
   the plurality of second dielectric layers are interposed between the plurality of first dielectric layers,
   the plurality of second dielectric layers are horizontally spaced apart from the plurality of gate structures, and
   the recessed portion is on outer sidewalls of the plurality of first dielectric layers and outer sidewalls of the plurality of second dielectric layers.

7. The semiconductor device of claim 6, wherein
the plurality of first dielectric layers are on the device region and the dummy region of the substrate,
the plurality of first dielectric layers are vertically spaced apart from each other,
the plurality of gate structures are between the plurality of first dielectric layers on the device region of the substrate, and
the plurality of gate structures are spaced apart from the dummy pattern.

8. The semiconductor device of claim 1, wherein
the substrate includes a crystalline semiconductor material, and
the substrate further includes an amorphous portion exposed on an outer sidewall of the substrate.

9. The semiconductor device of claim 1, further comprising:
a wiring layer on the cell array structure;
a plurality of chip pads on the wiring layer; and
a protection layer on the wiring layer, wherein
the protection layer exposes the plurality of chip pads, and
the protection layer does not vertically overlap the dummy pattern.

10. The semiconductor device of claim 1, wherein a width of the recessed portion is in a range of 3 nm to 50 nm.

* * * * *